US012597698B2

(12) United States Patent
Kim et al.

(10) Patent No.: US 12,597,698 B2
(45) Date of Patent: Apr. 7, 2026

(54) DISPLAY DEVICE

(71) Applicants:SAMSUNG DISPLAY CO., LTD., Yongin-si (KR); UNIST (ULSAN NATIONAL INSTITUTE OF SCIENCE AND TECHNOLOGY), Ulsan (KR)

(72) Inventors: Ki Seo Kim, Yongin-si (KR); Gangil Byun, Busan (KR); Jin Woo Kim, Yongin-si (KR); Jae Uk Choi, Yongin-si (KR); Hae Soo Eun, Ulsan (KR)

(73) Assignees: SAMSUNG DISPLAY CO., LTD., Yongin-si (KR); ULSAN NATIONALINSTITUTE OF SCIENCE ANDTECHNOLOGY

( * ) Notice: Subject to any disclaimer, the term of this patent is extended or adjusted under 35 U.S.C. 154(b) by 298 days.

(21) Appl. No.: 18/309,819

(22) Filed: Apr. 30, 2023

(65) Prior Publication Data

US 2024/0055751 A1     Feb. 15, 2024

(30) Foreign Application Priority Data

Aug. 12, 2022     (KR) ........................ 10-2022-0101496

(51) Int. Cl.
*H01Q 1/38* (2006.01)
*G06F 3/044* (2006.01)
(Continued)

(52) U.S. Cl.
CPC ........... *H01Q 1/243* (2013.01); *G06F 3/0446* (2019.05); *H01Q 1/38* (2013.01); *H04M 1/0274* (2013.01);
(Continued)

(58) Field of Classification Search
CPC ........ H01Q 1/243; H01Q 1/38; G06F 3/0446; H10K 59/40; H10K 59/123; H04M 1/0274; H04M 1/0277
See application file for complete search history.

(56) References Cited

U.S. PATENT DOCUMENTS 11,340,722 B2 * 5/2022 Oh ........................ G06F 3/0446

OTHER PUBLICATIONS

Arup Ray, et al. "A Fabrication Compatible On-chip Linear Tapered Slot Antenna with CPW Feed," 2019 IEEE International Symposium on Antennas and Propagation and USNC-URSI Radio Science Meeting, pp. 1887-1888.

* cited by examiner

*Primary Examiner* — Henry Luong
(74) *Attorney, Agent, or Firm* — F. CHAU & ASSOCIATES, LLC

(57) ABSTRACT

A display device includes a substrate that includes a display area that displays an image, a non-display area disposed around the display area, and an antenna area that protrudes from the non-display area, an antenna electrode disposed on one surface of the substrate in the non-display area, a feed line disposed on one surface of the substrate in the antenna area and spaced apart from the antenna electrode, a first electrode disposed on one surface of the substrate in the antenna area and the non-display area and disposed at one side of the feed line; and a second electrode disposed on one surface of the substrate in the antenna area and the non-display area and disposed on an other side of the feed line. A distance between the first electrode and the second electrode increases from one end of the feed line toward the antenna electrode.

23 Claims, 22 Drawing Sheets

(51) Int. Cl.

| | |
|---|---|
| *H01Q 1/24* | (2006.01) |
| *H04M 1/02* | (2006.01) |
| *H10K 59/123* | (2023.01) |
| *H10K 59/40* | (2023.01) |

(52) U.S. Cl.

CPC ........ *H04M 1/0277* (2013.01); *H10K 59/123*
(2023.02); *H10K 59/40* (2023.02)

AM: AL, AE, GND1, GND2, APD1, APD2, APD3

DISL: TFTL, EML

AM1/AM2/AM3/AM4 : AL, AE, GND1, GND2, APD1, APD2, APD3

AM1/AM2/AM3/AM4 : GND3

DISPLAY DEVICE

CROSS-REFERENCE TO RELATED APPLICATION

This U.S. non-provisional patent publication application claims priority under 35 U.S.C. § 119 from Korean Patent Application No. 10-2022-0101496, filed on Aug. 12, 2022 in the Korean Intellectual Property Office, the contents of which are herein incorporated by reference in their entirety.

TECHNICAL FIELD

Embodiments of the present disclosure are directed to a display device.

DISCUSSION OF THE RELATED ART

As the information society develops, the demand for display devices that display images is increasing in various forms. For example, display devices are incorporated into various electronic devices, such as a smart phone, a digital camera, a notebook computer, a navigation system, and a smart television.

A display device may include an antenna that transmits and receives electromagnetic waves for wireless communication. For example, a display device may include an antenna that performs $4^{th}$ generation (4G) mobile communication and $5^{th}$ generation (5G) mobile communication such as Long Term Evolution (LTE). The frequency band of the electromagnetic wave varies according to communication technology, and the shape or length of the antenna varies according to the frequency band of the electromagnetic wave. Therefore, the display device includes an antenna electrode whose shape or length is determined according to the frequency band of the electromagnetic wave.

SUMMARY

At least one embodiment of the present disclosure provides a display device that includes an antenna electrode and is capable of proximity sensing, such as gesture sensing.

According to an embodiment of the present disclosure, a display device includes a substrate that includes a display area that displays an image, a non-display area disposed around the display area, and an antenna area that protrudes from the non-display area, an antenna electrode disposed on one surface of the substrate in the non-display area, a feed line disposed on the one surface of the substrate in the antenna area and spaced apart from the antenna electrode, a first electrode disposed on the one surface of the substrate in the antenna area and the non-display area and disposed at one side of the feed line; and a second electrode disposed on the one surface of the substrate in the antenna area and the non-display area and disposed on another side of the feed line. A distance between the first electrode and the second electrode increases from one end of the feed line toward the antenna electrode.

A minimum distance between the feed line and the first electrode may be less than a minimum distance between the antenna electrode and the first electrode.

A minimum distance between the feed line and the second electrode may be less than a minimum distance between the antenna electrode and the second electrode.

The antenna area and the non-display area may include a feed area in which the feed line is disposed, and a radiation area in which the antenna electrode is disposed. The first electrode may be disposed in the feed area and the radiation area. A width of the first electrode may decrease from a boundary of the feed area and the radiation area toward an end of the first electrode in the radiation area.

The antenna area and the non-display area may include a feed area in which the feed line is disposed, and a radiation area in which the antenna electrode is disposed. The second electrode may be disposed in the feed area and the radiation area. A width of the second electrode may decrease from a boundary of the feed area and the radiation area toward an end of the second electrode in the radiation area.

The feed line may extend in one direction. The display device may further include a stub that protrudes from one side of the feed line in another direction that crosses the one direction.

The antenna electrode may be a patch antenna electrode that has a rectangular planar shape.

The display device may further include a third electrode disposed on another surface of the substrate in the antenna area.

The third electrode may overlap the feed line, the first electrode, and the second electrode in a thickness direction of the substrate.

A thickness of the third electrode may be greater than a thickness of the antenna electrode, a thickness of the feed line, a thickness of the first electrode, and a thickness of the second electrode.

A thickness of the antenna electrode, a thickness of the feed line, a thickness of the first electrode, and a thickness of the second electrode may be equal to each other.

The display device may further include a first antenna pad disposed at one end of the feed line, a second antenna pad disposed at one end of the first electrode, a third antenna pad disposed at one end of the second electrode, and an antenna circuit board connected to the first antenna pad, the second antenna pad, and the third antenna pad, a conductive adhesive member disposed between each of the first antenna pad, the second antenna pad, and the third antenna pad and the antenna circuit board, a main circuit board that includes a second connector connected to a first connector that is disposed at one end of the antenna circuit board, and an antenna driving circuit disposed on the main circuit board and configured to transmit an electromagnetic wave signal to the antenna electrode or receive an electromagnetic wave signal from the antenna electrode.

The display device may further include a dam that surrounds the display area in the non-display area. The antenna electrode may be disposed between the dam and an edge of the substrate.

According to an embodiment of the present disclosure, a display device includes a substrate that includes a display area that displays an image, a non-display area disposed around the display area, and an antenna area that protrudes from the non-display area, an antenna electrode disposed on one surface of the substrate in the non-display area, a feed line disposed on the one surface of the substrate in the antenna area, where the feed line is spaced apart from the antenna electrode and extends in one direction, a first electrode disposed on the one surface of the substrate in the antenna area and the non-display area and at one side of the feed line, a second electrode disposed on the one surface of the substrate in the antenna area and the non-display area and at another side of the feed line, and a stub that protrudes from the one side of the feed line in another direction that crosses the one direction.

A distance between the first electrode and the second electrode may increase from one end of the feed line toward the antenna electrode.

A minimum distance between the feed line and the first electrode may be less than a minimum distance between the antenna electrode and the first electrode.

A minimum distance between the feed line and the second electrode may be less than a minimum distance between the antenna electrode and the second electrode.

The antenna area and the non-display area may include a feed area in which the feed line is disposed, and a radiation area in which the antenna electrode is disposed. The first electrode may be disposed in the feed area and the radiation area. A width of the first electrode may decrease from a boundary of the feed area and the radiation area toward one end of the first electrode in the radiation area.

The antenna area and the non-display area may include a feed area in which the feed line is disposed, and a radiation area in which the antenna electrode is disposed. The second electrode may be disposed in the feed area and the radiation area. A width of the second electrode may decrease from a boundary of the feed area and the radiation area toward one end of the second electrode in the radiation area.

An area of the second electrode may be greater than an area of the first electrode.

According to an embodiment of the present disclosure, a display device includes a substrate, a gate insulating layer disposed on one surface of the substrate; a gate electrode of a thin film transistor disposed on the gate insulating layer, a first interlayer insulating layer disposed on the gate electrode of the thin film transistor, a first connection electrode disposed on the first interlayer insulating layer and connected to an active layer of the thin film transistor through a contact hole that penetrates the gate insulating layer and the first interlayer insulating layer, a first organic layer disposed on the first connection electrode, a pixel electrode disposed on the first organic layer, and an antenna electrode, a feed line, a first electrode, and a second electrode disposed on the one surface of the substrate and spaced apart from each other. The antenna electrode, a feed line, a first electrode, and a second electrode include a first electrode layer made of a same material as a gate electrode of the thin film transistor, a second electrode layer made of a same material as the first connection electrode, and a third electrode layer made of a same material as the pixel electrode.

The display device may further include a light emitting layer disposed on the pixel electrode, a common electrode disposed on the light emitting layer, an encapsulation layer disposed on the common electrode, and a sensor electrode disposed on the encapsulation layer. The antenna electrode, the feed line, the first electrode, and the second electrode may further include a fourth electrode layer made of a same material as the sensor electrode.

The display device may further include a third electrode disposed on another surface of the substrate. A thickness of the third electrode is greater than a thickness of the first antenna electrode layer, a thickness of the second antenna electrode layer, a thickness of the third antenna electrode layer, and a thickness of the fourth antenna electrode layer.

According to a display device according to an exemplary embodiment, an antenna module is formed in the antenna area that protrudes from one side of the non-display area of the display panel and in the non-display area of the main area adjacent to the antenna area. Since the antenna area is bent under the display panel and only the antenna electrode is formed outside the dam in the non-display area, there is no need to provide a separate space in the display panel for the antenna module.

According to a display device according to an exemplary embodiment, the influence of the electromagnetic wave radiated from the feed line in the radiation area by the external dielectric and conductor can be reduced by including the antenna electrode formed in an island pattern in a tapered-slot shaped radiation area. In addition, the impedance is matched between the antenna electrode and the feed line.

According to a display device according to an exemplary embodiment, the radiation performance of an antenna can be increased by changing the phase of the radiation pattern of the electromagnetic wave by including a stub that protrudes from one side of the feed line.

BRIEF DESCRIPTION OF THE DRAWINGS

FIG. 14 is a cross-sectional view of a display device taken along line B-B' of FIGS. 11 and 12.

FIG. 15 is a cross-sectional view of a display device taken along line C-C' of FIGS. 11 and 12.

DETAILED DESCRIPTION

Figure 1:
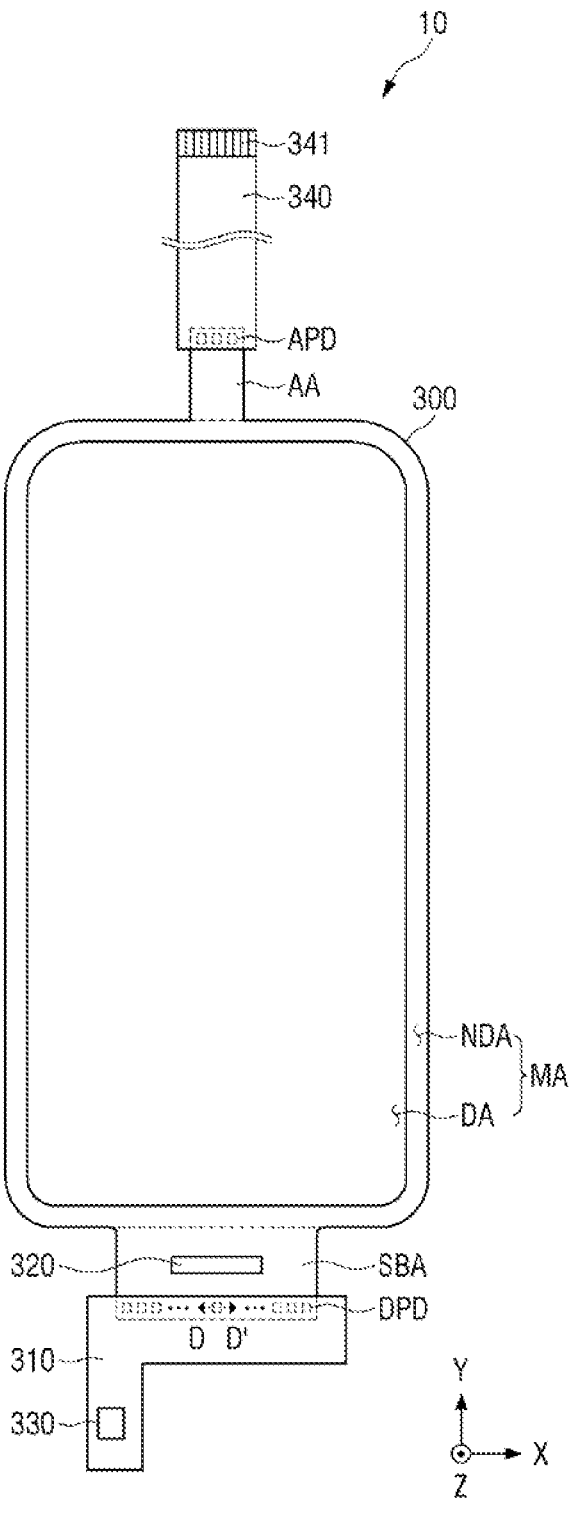
FIGS. 1 and 2 are plan views of a display device according to one or more embodiments.

Embodiments of the present disclosure will be described more fully hereinafter with reference to the accompanying drawings. Like reference numerals may refer to like elements throughout the specification and the accompanying drawings.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity. such as the limitations of the measurement system. For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present.

It will be further understood that descriptions of features or aspects within each embodiment are available for other similar features or aspects in other embodiments, unless the context clearly indicates otherwise. Accordingly, all features and structures described herein may be mixed and matched in any desirable manner.

Figure 2:
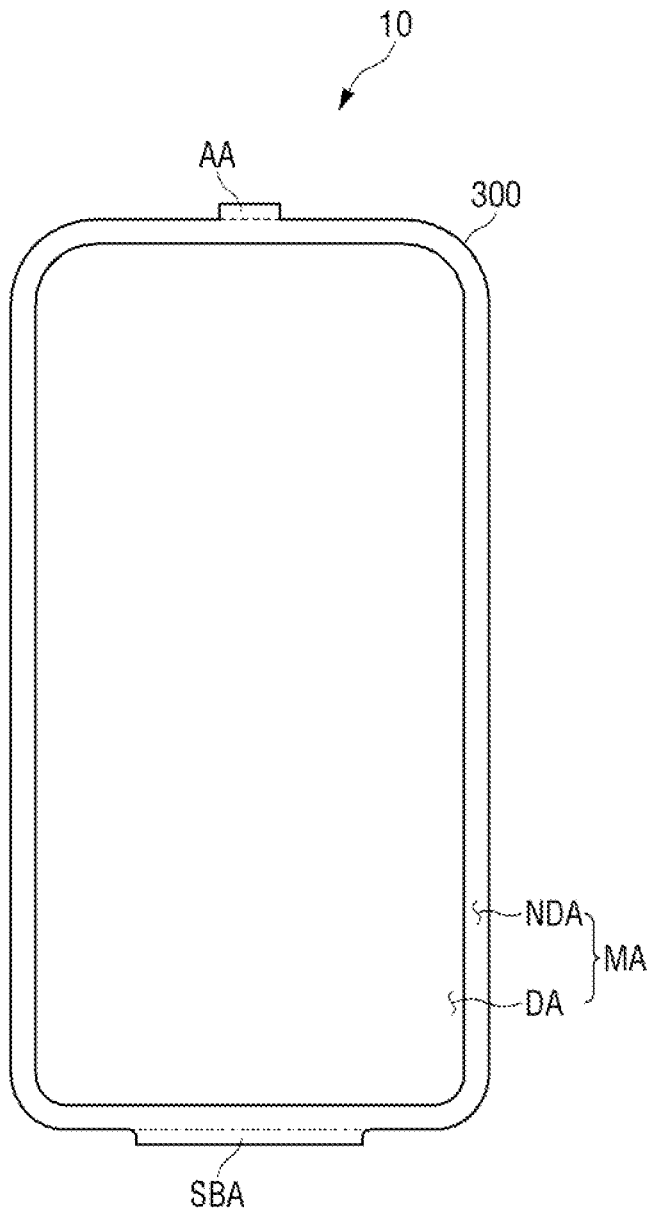

FIGS. 1 and 2 are plan views of a display device according to one or more embodiments.

Referring to FIGS. 1 and 2, a display device 10 according to one or more embodiments can be incorporated into a portable electronic device such as a mobile phone, a smart phone, a tablet personal computer (PC), a mobile communication terminal, an electronic notebook, an electronic book, a portable multimedia player (PMP), a navigation system, and an ultra mobile PC (UMPC). Alternatively, the display device 10 according to one or more embodiments can be a display unit of a television, a notebook computer, a monitor, a billboard, or an Internet of Things (JOT) device. Alternatively, the display device 10 according to one or more embodiments can be incorporated into a wearable device such as a smart watch, a watch phone, a glasses display, and a head mounted display (HMD). Alternatively, the display device 10 according to one or more embodiments can be incorporated into a dashboard of a vehicle, a center fascia of the vehicle, a center information display (CID) disposed on a dashboard of the vehicle, and a room mirror display instead of a side mirror of the vehicle, or be placed on the back of the front seat as entertainment for the rear seat of the vehicle.

In this disclosure, a first direction (X-axis direction) is a short side direction of the display device 10, such as a horizontal direction of the display device 10. A second direction (the Y-axis direction) is a long side direction of the display device 10, such as a vertical direction of the display device 10. A third direction (Z-axis direction) is a thickness direction of the display device 10. An edge where the short side in the first direction (X-axis direction) and the long side in the second direction (Y-axis direction) meet may be rounded with a predetermined curvature or may form a right angle.

The display device 10 according to one or more embodiments includes a display panel 300, a display circuit board 310, a display driving circuit 320, a touch driving circuit 330, an antenna circuit board 340, and a first connector 341.

The display panel 300 may be a light emitting display panel that includes a light emitting element. For example, the display panel 300 may be one of an organic light emitting display panel that uses an organic light emitting diode that includes an organic light emitting layer, a micro light emitting diode display panel that uses a micro LED, a quantum dot light emitting display panel that uses a quantum dot light emitting diode that includes a quantum dot light emitting layer, or an inorganic light emitting display panel that uses an inorganic light emitting device that includes an inorganic semiconductor.

The display panel 300 is a flexible display panel that is flexible and can be easily bent, folded, or rolled. For example, the display panel 300 is one of a foldable display panel that can be folded and unfolded, a curved display panel in which the display surface is curved, a bent display panel in which an area other than the display surface is bent, a rollable display panel that can be rolled or a stretchable display panel that can be stretched.

The display panel 300 includes a main area MA, a sub area SBA that protrudes from one side of the main area MA, and an antenna area AA that protrudes from the other side of the main area MA.

The main area MA includes a display area DA that displays an image and a non-display area NDA that is a peripheral area of the display area DA. The display area DA occupies most of the main area MA. The display area DA is disposed in the center of the main area MA. The non-display area NDA is outside of the display area DA. The non-display area NDA is an edge area of the display panel 300.

The sub area SBA protrudes in the second direction (Y-axis direction) from one side of the main area MA. For example, one side of the main area MA is a bottom side of the main area MA. As shown in FIG. 1, a length in the first direction (X-axis direction) of the sub-area SBA is less than a length in the first direction (X-axis direction) of the main area MA, and a length of the sub area SBA in the second direction (Y-axis direction) is less than a length of the main area MA in the second direction (Y-axis direction), but embodiments of the present disclosure are not necessarily limited thereto.

As shown in FIG. 2, the sub area SBA can be bent and disposed under the display panel 300. For example, the sub area SBA overlaps the main area MA of the display panel 300 in the third direction (Z-axis direction).

Display pads DPD are disposed on one side edge of the sub area SBA. For example, the one side edge of the sub area SBA is a bottom edge of the sub area SBA. The display circuit board 310 is attached onto the display pads DPD of the sub area SBA. The display circuit board 310 is attached to the display pads DPD of the sub area SBA using a conductive adhesive member such as an anisotropic conductive film and an anisotropic conductive paste. The display circuit board 310 is a composite printed circuit board that includes flexible printed circuit boards (FPCB) that can be bent, rigid printed circuit boards (PCB) that are rigid and not easily bent, or both a rigid printed circuit board and a flexible printed circuit board.

The display driving circuit 320 is disposed on the sub area SBA of the display panel 300. The display driving circuit 320 receives control signals and power voltages and generates and outputs signals and voltages that drive the display panel 300. The display driving circuit 320 is an integrated circuit (IC).

The touch driving circuit 330 is disposed on the display circuit board 310. The touch driving circuit 330 is an integrated circuit. The touch driving circuit 330 is attached onto the display circuit board 310.

The touch driving circuit 330 is electrically connected to the sensor electrodes of a sensor electrode layer of the display panel 300 through the display circuit board 310. Therefore, the touch driving circuit 330 can output a touch driving signal to each of the sensor electrodes and sense a voltage charged in a mutual capacitance of the sensor electrodes.

The sensor electrode layer of the display panel 300 sense a contact touch rather than a proximity touch. A contact touch refers to direct contact of an object, such as a human finger or a pen, with a cover window disposed on the sensor electrode layer. Proximity touch refers to an object, such as a person's finger or a pen, being placed in close proximity to a cover window, such as hovering.

A power supply unit that supplies driving voltages that drive the display pixels of the display panel 300 and the display driving circuit 320 is additionally disposed on the display circuit board 310. Alternatively, the power supply unit is integrated with the display driving circuit 320, and the display driving circuit 320 and the power supply unit are one integrated circuit.

The antenna area AA includes at least one of an antenna electrode, a feed line, or a electrode of an antenna module for wireless transmission and reception. The antenna area AA protrudes in the second direction (Y-axis direction) from the other side of the main area MA. For example, the other side of the main area MA is an upper side of the main area MA. As shown in FIG. 1, the length in the first direction (X-axis direction) of the antenna area AA is less than the length of the main area MA in the first direction (X-axis direction), and the length in the second direction (Y-axis direction) of the antenna area AA is less than the length in the second direction (Y-axis direction) of the main area MA, but embodiments of the present disclosure are not necessarily limited thereto.

As shown in FIG. 2, the antenna area AA can be bent and disposed under the display panel 300. The antenna area AA overlaps the main area MA of the display panel 300 in the third direction (Z-axis direction).

Antenna pads APD are disposed at one edge of the antenna area AA. For example, the one edge of the antenna area AA is a tip edge of the antenna area AA. The antenna circuit board 340 is attached onto the antenna pads APD of the antenna area AA. The antenna circuit board 340 is attached onto the antenna pads APD of the antenna area AA using an anisotropic conductive film and an conductive adhesive member such as the anisotropic conductive adhesive. One side of the antenna circuit board 340 includes a first connector connected to the main circuit board on which the antenna driving circuit (350 of FIG. 4) is mounted. The antenna circuit board 340 is a bendable flexible circuit board (FPCB).

Figure 3:
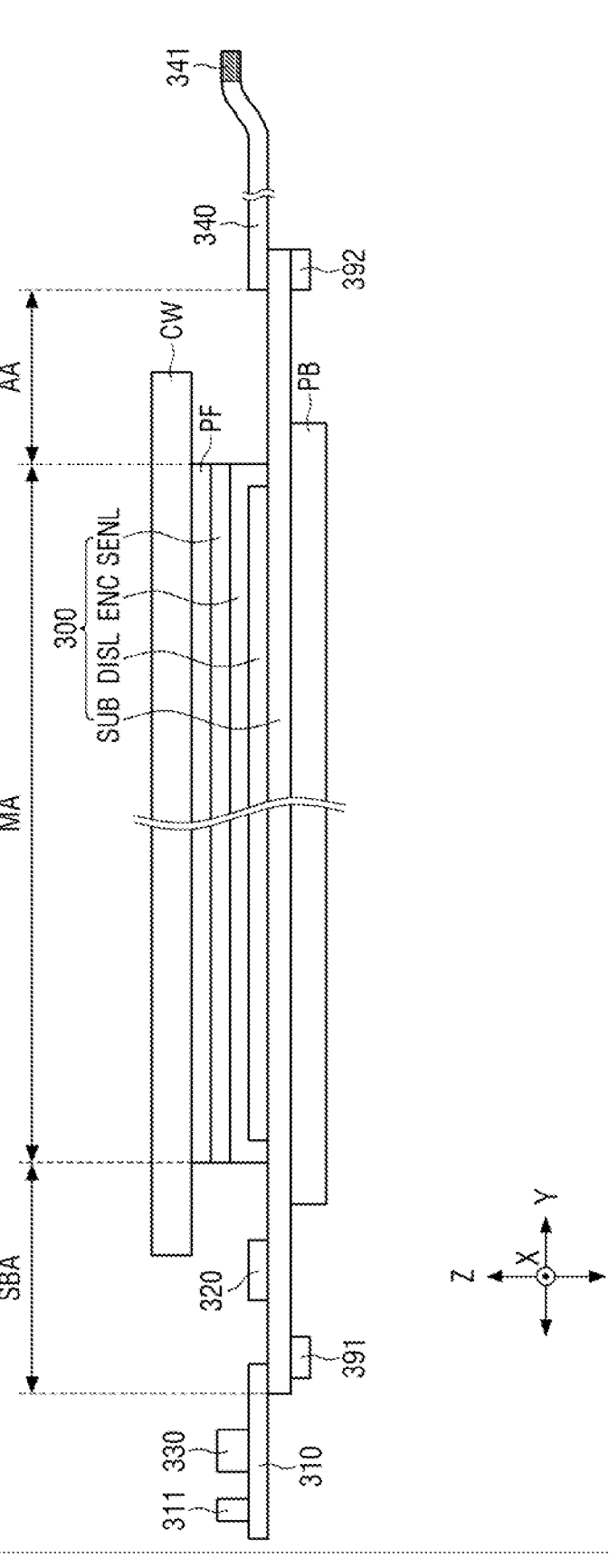
FIGS. 3 and 4 are side views of a display device according to one or more embodiments.
Figure 4:
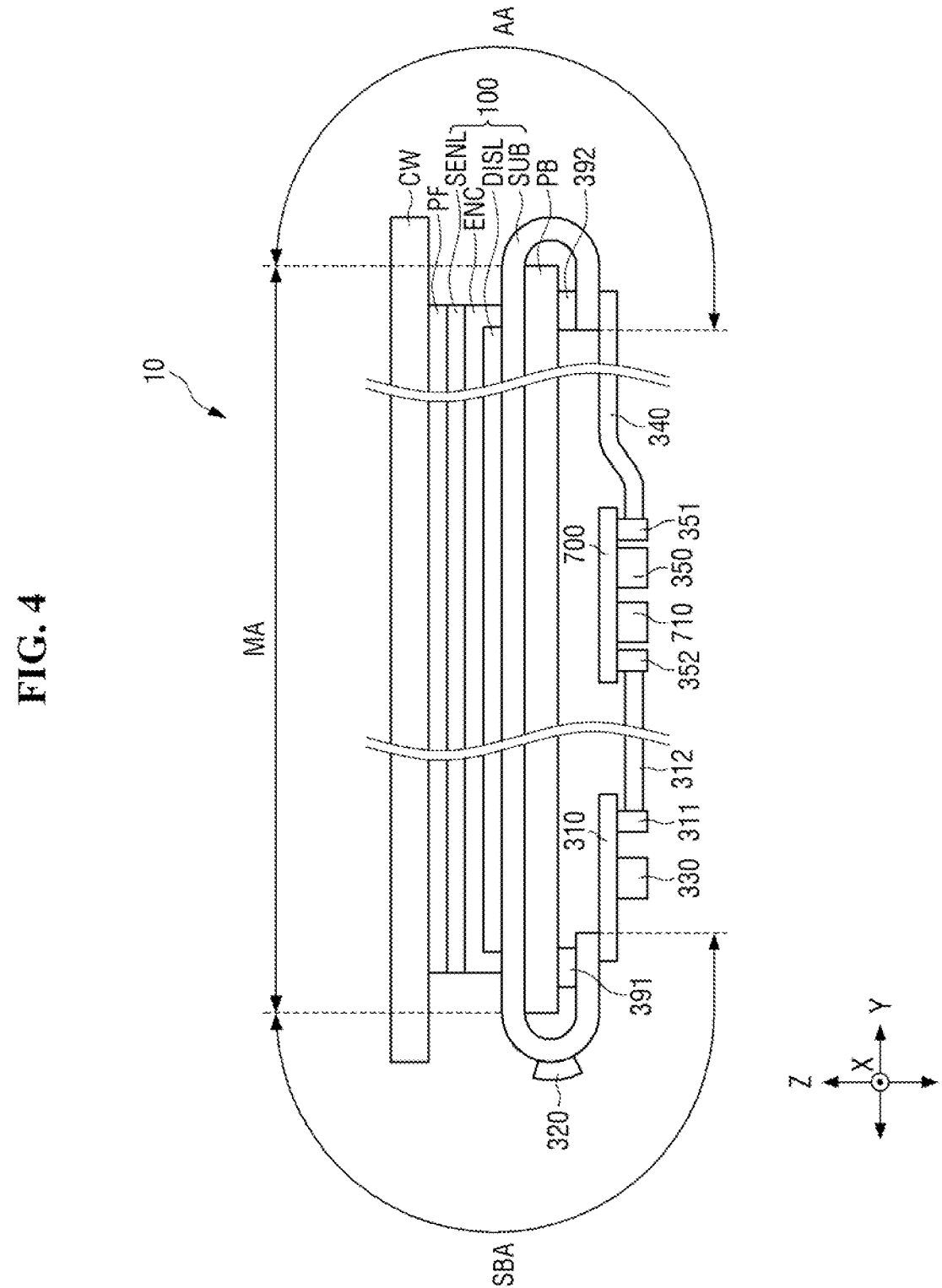

FIGS. 3 and 4 are side views of a display device according to one or more embodiments.

Referring to FIGS. 3 and 4, the display device 10 according to one or more embodiments include the display panel 300, a polarizing film PF, a cover window CW, and a panel bottom cover PB. The display panel 300 may include a substrate SUB, a display layer DISL, an encapsulation layer ENC, and a sensor electrode layer SENL.

The substrate SUB is made of an insulating material such as a polymer resin. The substrate SUB is a flexible substrate capable of being bent, folded, rolled, etc.

The display layer DISL is disposed on the main area MA of the substrate SUB. The display layer DISL displays an image and includes light emitting areas. The display layer DISL includes a thin film transistor layer in which thin film transistors are formed, and a light emitting element layer in which light emitting elements that emits light are disposed in light emitting areas.

In the display area DA of the display layer DISL, scan lines, data lines, and power supply lines that drive the light emitting elements in the light emitting areas are disposed. In the non-display area NDA of the display layer DISL, a scan driver that outputs scan signals to the scan lines, and fan-out lines that connect the data lines and the display driving circuit 320 are disposed.

The encapsulation layer ENC is disposed on the display layer DISL. The encapsulation layer ENC encapsulates the light emitting element layer of the display layer DISL and prevents oxygen and moisture from penetrating into the light emitting element layer of the display layer DISL. The encapsulation layer ENC is disposed on the top surface and side surfaces of the display layer DISL.

The sensor electrode layer SENL is disposed on the display layer DISL. The sensor electrode layer SENL includes sensor electrodes. The sensor electrode layer SENL senses a touch using sensor electrodes.

The polarizing film PF is disposed on the sensor electrode layer SENL. The polarizing film PF includes a first base member, a linear polarizing plate, a retardation film such as a $\lambda/4$ plate (quarter-wave plate), and a second base member. The first base member, a phase delay film, the linear polarizer, and the second base member are sequentially stacked on the sensor electrode layer SENL.

The cover window CW is disposed on the polarizing film PF. The cover window CW is attached to the polarizing film PF by a transparent adhesive member such as an optically clear adhesive (OCA) film.

The panel bottom cover PB is disposed under the display panel 300. The panel bottom cover PB is attached to the lower (or bottom) surface of the display panel 300 through the adhesive member. The adhesive member may be a pressure sensitive adhesive (PSA). The panel bottom cover PB includes at least one light blocking member that absorbs externally incident light, a buffer member that absorbs external impacts, and/or a heat dissipation member that dissipates heat from the display panel 300.

The light blocking member is disposed under the display panel 300. The light blocking member blocks light transmission to prevent components disposed under the light blocking member, such as the display circuit board 310, from being viewed from above the display panel 300. The light blocking member includes a light absorbing material such as a black pigment or a black dye.

The buffer member is disposed under the light blocking member. The buffer member absorbs an external shock and prevents damage to the display panel 300. The buffer member may be formed of a single layer or a plurality of layers. For example, the buffer member is formed of a polymer resin such as polyurethane, polycarbonate, polypropylene, polyethylene, etc., or includes an elastic material, such as rubber, a urethane-based material, or a sponge formed by foam molding an acrylic-based material.

The heat dissipation member is disposed under the buffer member. The heat dissipation member includes a first heat dissipation layer that includes graphite or carbon nanotubes and a second heat dissipation layer formed of a thin metal film such as copper, nickel, ferrite, or silver, which shields electromagnetic waves and is thermally conductive.

As shown in FIG. 4, the sub area SBA of the substrate SUB can be bent and disposed under the display panel 300. The sub area SBA of the substrate SUB is attached to the lower surface of the panel bottom cover PB by a first adhesive member 391. The first adhesive member 391 may be a pressure-sensitive adhesive.

In addition, as shown in FIG. 4, the antenna area AA of the substrate SUB can be bent and disposed under the display panel 300. The antenna area AA of the substrate SUB is attached to the lower surface of the panel bottom cover PB by a second adhesive member 392. The second adhesive member 392 may be a pressure-sensitive adhesive.

The display circuit board 310 is attached to the display pads DPD of the sub area SBA of the substrate SUB using the anisotropic conductive film and the conductive adhesive member such as the anisotropic conductive adhesive. The display circuit board 310 includes a connector 311 that is connected to a flexible circuit board 312. The flexible circuit board 312 is connected to a main circuit board 700 by a connector 352.

The touch driving circuit 330 is disposed on the display circuit board 310. The touch driving circuit 330 generates touch data based on a change in an electrical signal sensed by each of the sensor electrodes of the sensor electrode layer of the display panel 300 and transmits the touch data to a main processor 710 of the main circuit board 700. The main processor 710 calculates touch coordinates of a touch occurrence by analyzing the touch data.

The antenna circuit board 340 is attached to the antenna pads APD of the antenna area AA of the substrate SUB using the conductive adhesive member such as the anisotropic conductive film and the anisotropic conductive adhesive. A connector 351 connects the antenna circuit board 340 to the main circuit board 700. The antenna area AA is connected to the main circuit board 700 by the antenna circuit board 340.

The main circuit board 700 is a rigid printed circuit board (PCB) that is not easily bent. The main processor 710 and an antenna driving circuit 350 are disposed on the main circuit board 700.

The antenna driving circuit 350 is electrically connected to the antenna electrodes of the display panel 300 through the antenna circuit board 340. Therefore, the antenna driving circuit 350 can receive an electromagnetic wave signal received by the antenna electrodes and transmit the electromagnetic wave signal to the antenna electrodes. An antenna circuit board 340 is an integrated circuit (IC).

The antenna driving circuit 350 processes electromagnetic wave signals transmitted to and received from the antenna electrodes. For example, the antenna driving circuit 350 changes the amplitude of the electromagnetic wave signal received by the antenna electrodes. Alternatively, an antenna driving circuit 350 changes the phase as well as the amplitude of the electromagnetic wave signal received by the antenna electrodes. The antenna driving circuit 350 transmits the processed electromagnetic wave signal to a mobile communication module. The mobile communication module is disposed on the main circuit board 700.

In addition, the antenna driving circuit 350 changes the amplitude of the electromagnetic wave signal received from the mobile communication module. Alternatively, the antenna driving circuit 350 changes the phase as well as the amplitude of the electromagnetic wave signal received from the mobile communication module. The antenna driving circuit 350 transmits the processed electromagnetic wave signal to the antenna electrodes.

Figure 5:
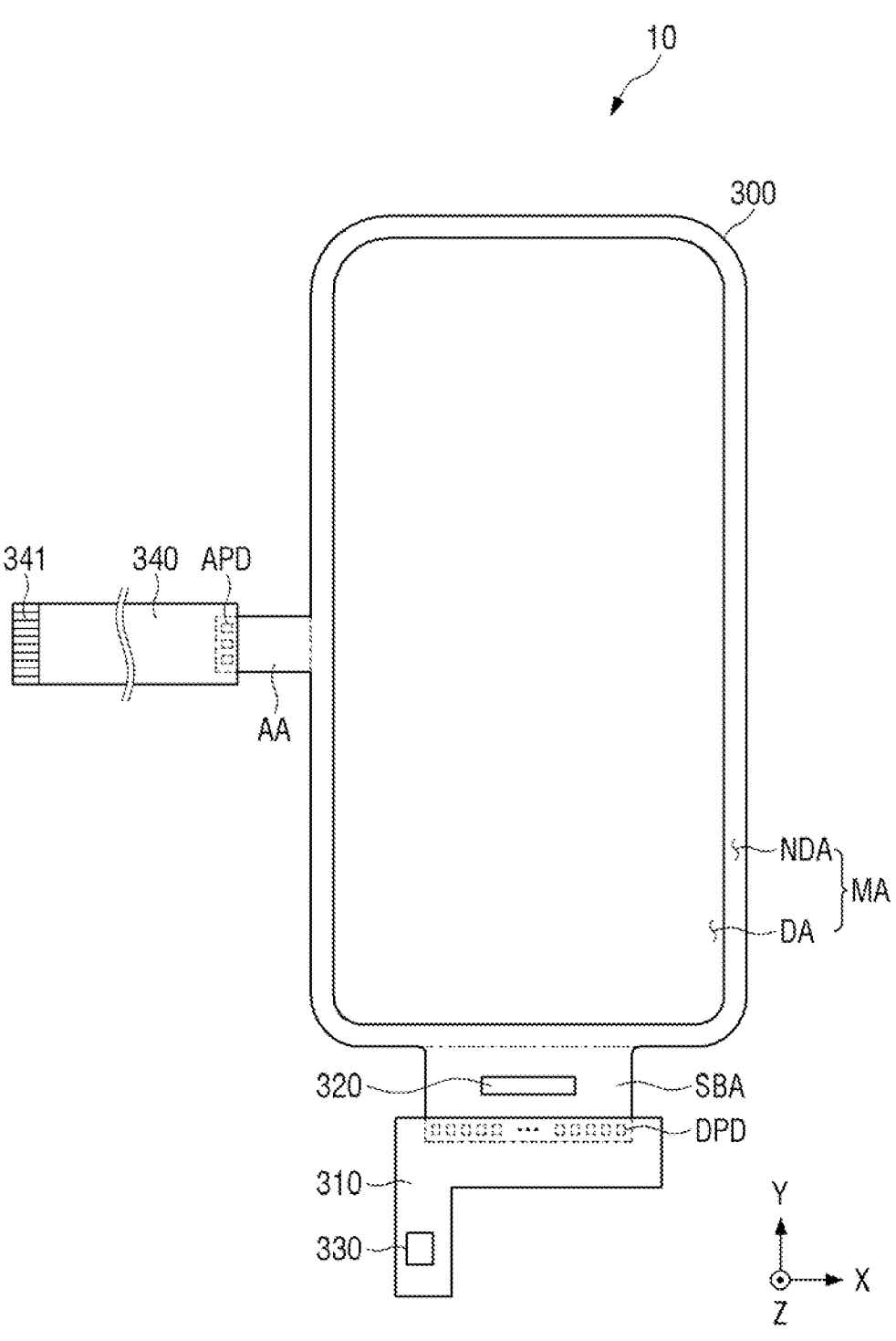
FIGS. 5 and 6 are plan views of a display device according to one or more embodiments.
Figure 6:
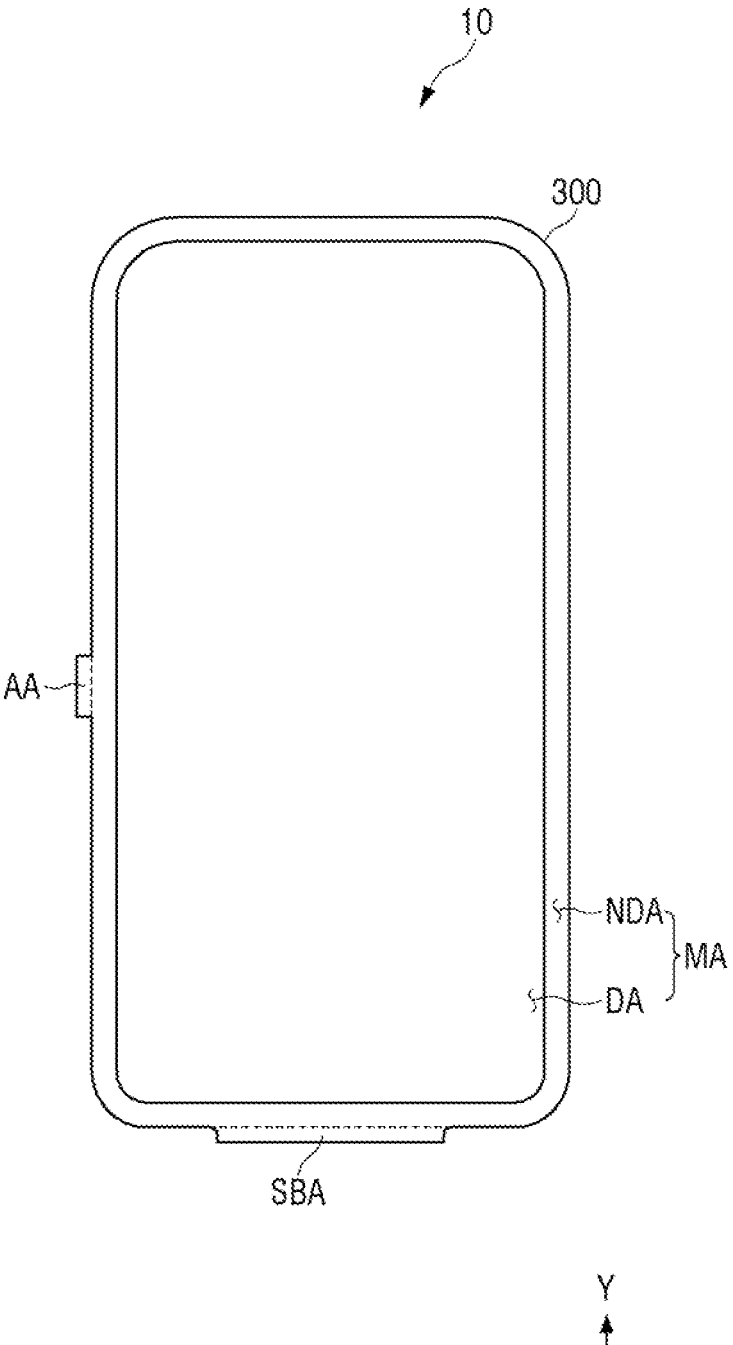
Figure 7:
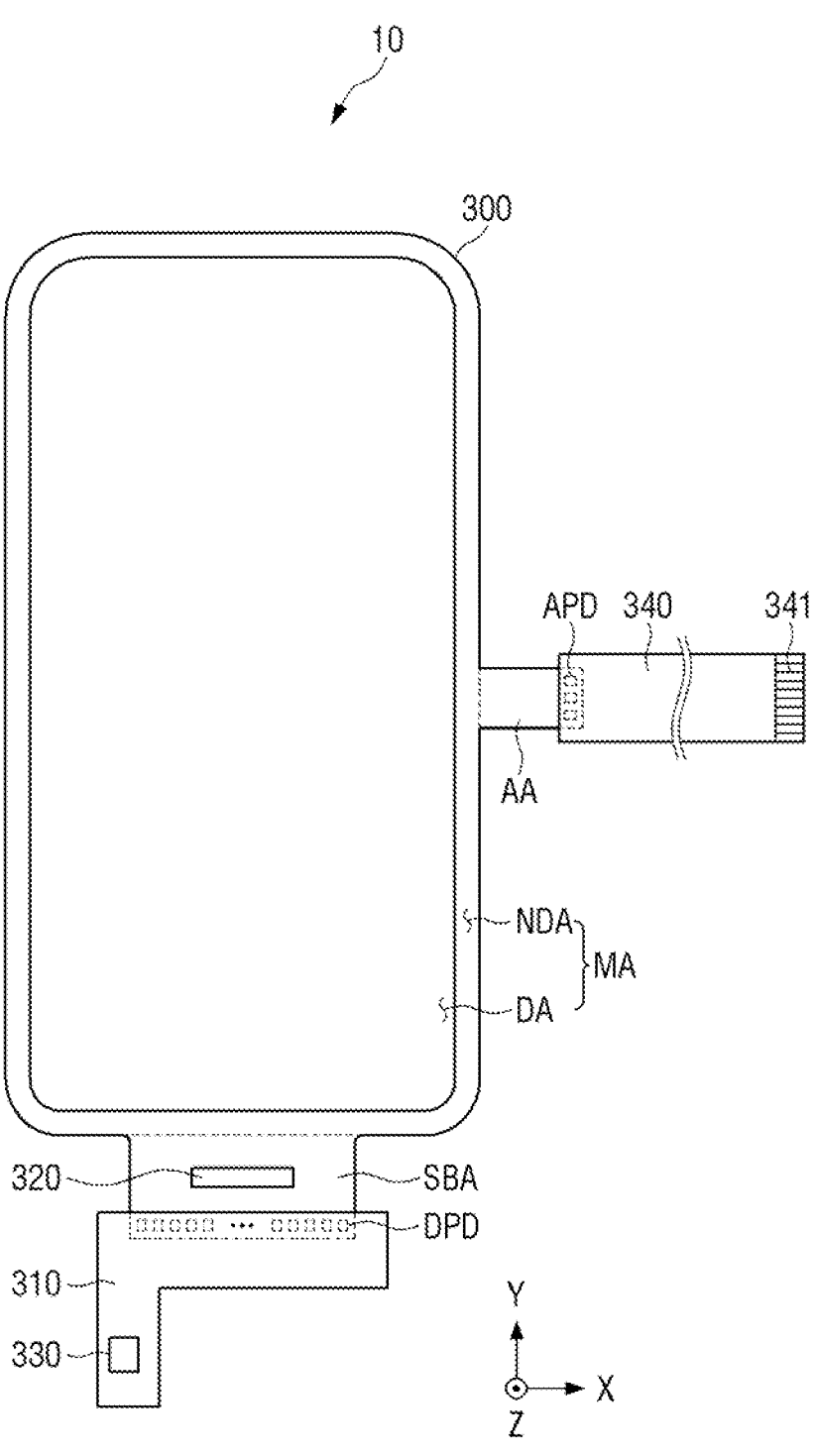
FIGS. 7 and 8 are plan views of a display device according to one or more embodiments.
Figure 8:
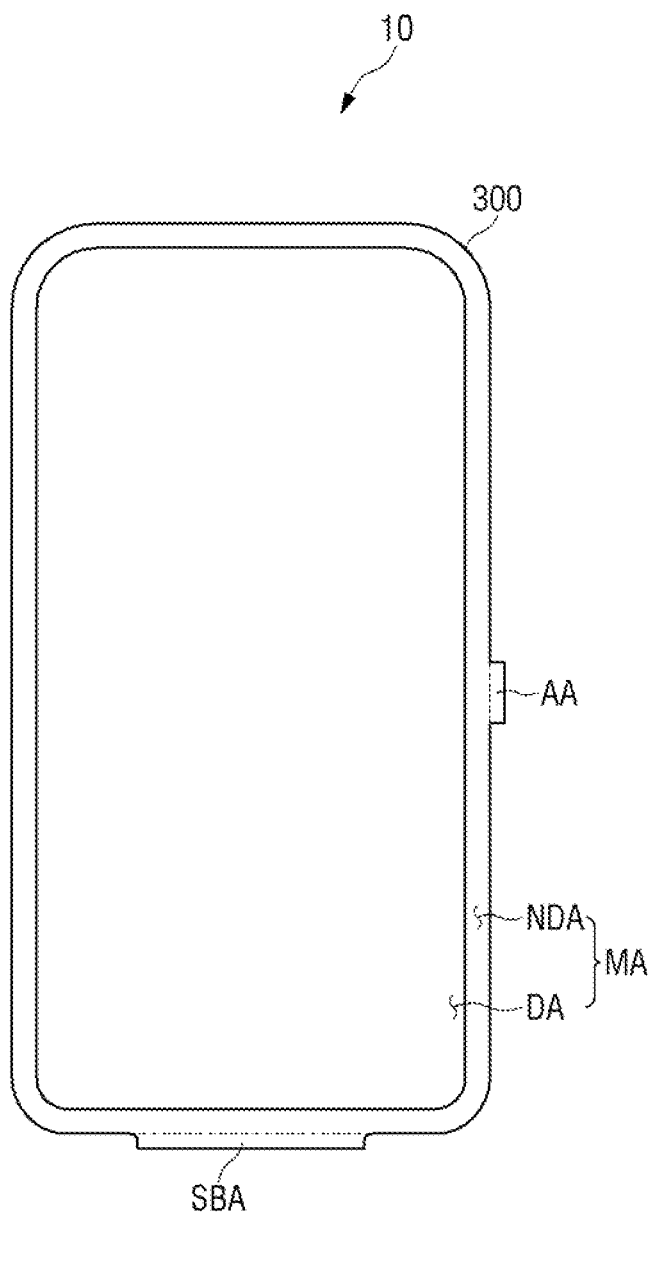

FIGS. 5 and 6 are plan views of a display device according to one or more embodiments. FIGS. 7 and 8 are plan views of a display device according to one or more embodiments.

The embodiments of FIGS. 5 and 6 differ from the embodiments of FIGS. 1 and 2 in that the antenna area AA protrudes in the first direction (X-axis direction) from the left side of the main area MA. The embodiments of FIGS.

7 and 8 differ from the embodiments of FIGS. 1 and 2 in that the antenna area AA protrudes in the first direction (X-axis direction) from the right side of the main area MA. In FIGS. 5 to 8, descriptions that repeat those of the embodiments of FIGS. 1 and 2 may be omitted.

As shown FIGS. 5 to 8, in some embodiments, the antenna area AA protrudes from one side of the main area MA, and the one side of the main area MA may be one of the upper, lower, left, or right sides of the main area MA.

When the antenna area AA protrudes from the lower side of the main area MA in the second direction (Y-axis direction), the antenna area AA is spaced apart from the sub-area SBA in the first direction (X-axis direction). The length in the first direction (X-axis direction) of the antenna area AA is less than the length in the first direction (X-axis direction) of the sub area SBA, and the length in the second direction (Y-axis direction) of the antenna area AA is less than the length of the second direction (Y-axis direction) of the sub-area SBA, but embodiments of the present disclosure are not necessarily limited thereto.

Figure 9:
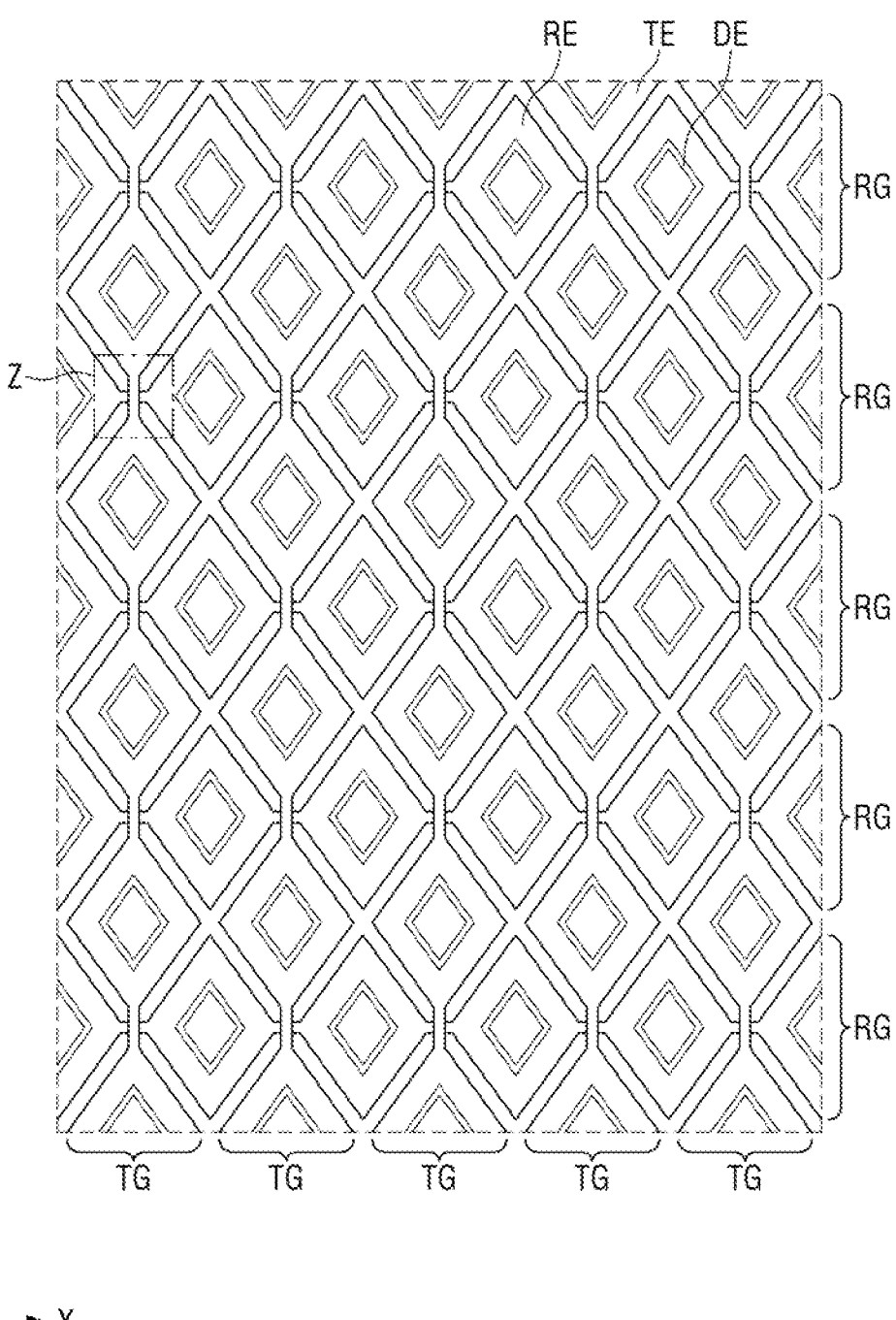
FIG. 9 is a layout diagram a display area of FIG. 1.

FIG. 9 is a layout diagram of a display area of FIG. 1.

FIG. 9 shows that sensor electrodes SE of the sensor electrode layer SENL include two types of electrodes, driving electrodes TE and sensing electrodes RE, that are driven in a mutual capacitance method that senses the voltage charged through the sensing electrodes RE after transmitting a driving signal to the driving electrodes TE, but embodiments of the present disclosure are not necessarily limited thereto. In FIG. 9, only the sensor electrodes TE and RE and a dummy pattern DE are illustrated for convenience of illustration.

Referring to FIG. 9, in an embodiment, the display area DA includes the sensor electrodes SE and dummy patterns DE. The sensor electrodes SE sense a touch of an object or a person by forming a mutual capacitance.

The sensor electrodes SE include driving electrodes TE and sensing electrodes RE. The sensing electrode RE may be defined as a first sensor electrode, the driving electrode TE may be defined as a second sensor electrode, the sensing line connected to the sensing electrodes RE may be defined as a first sensor line, and the driving line connected to the driving electrodes TE may be defined as a second sensor line. Alternatively, the driving electrode TE may be defined as the first sensor electrode, the sensing electrode RE may be defined as the second sensor electrode, the driving line may be defined as the first sensor line, and the sensing line may be defined as the second sensor line.

The display area DA includes a plurality of sensing electrode groups RG and a plurality of driving electrode groups TG.

The plurality of sensing electrode groups RG extend in the first direction (X-axis direction) and are arranged in the second direction (Y-axis direction). Each of the plurality of sensing electrode groups RG includes a plurality of sensing electrodes RE. In each of the plurality of sensing electrode groups RG, the sensing electrodes RE may be arranged in the first direction (X-axis direction). In each of the plurality of sensing electrode groups RG, the sensing electrodes RE are electrically connected in the first direction (X-axis direction). For example, sensing electrodes RE adjacent in the first direction (X-axis direction) are connected to each other, but sensing electrodes RE adjacent in the second direction (Y-axis direction) are electrically separated from each other.

The plurality of driving electrode groups TG extend in the second direction (Y-axis direction) and are arranged in the first direction (X-axis direction). Each of the plurality of driving electrode groups TG includes a plurality of driving electrodes TE. In each of the plurality of driving electrode groups TG, the driving electrodes TE are arranged in the second direction (Y-axis direction). In each of the plurality of driving electrode groups TG, the plurality of driving electrodes TE are electrically connected in the second direction (Y-axis direction). For example, driving electrodes TE adjacent in the second direction (Y-axis direction) are connected to each other, but driving electrodes TE adjacent in the first direction (X-axis direction) are electrically separated from each other.

Each of the dummy patterns DE is surrounded by a driving electrode TE or a sensing electrode RE. Each of the dummy patterns DE is electrically separated from the driving electrode TE or the sensing electrode RE. Each of the dummy patterns DE spaced apart from the driving electrode TE or the sensing electrode RE. Each of the dummy patterns DE electrically floats.

FIG. 9 shows that each of the driving electrodes TE, the sensing electrodes RE, and the dummy patterns DE has a rhombus planar shape, but embodiments are not necessarily limited thereto. For example, in other embodiments, each of the driving electrodes TE, the sensing electrodes RE, and the dummy patterns DE has a flat shape other than a rhombus, such as a polygon other than a rhombus, a circle, or an ellipse.

The plurality of sensing electrode groups RG are connected in one-to-one correspondence to the sensing lines. For example, each of the plurality of sensing electrode groups RG is connected to the sensing line at the right end or the left end. The sensing lines are connected to some of the display pads DPD of the sub area SBA. Therefore, the sensing lines are electrically connected to the touch driving circuit 330 through some of the display pads DPD and the display circuit board 310.

The plurality of driving electrode groups TG are connected in one-to-one correspondence to the driving lines. For example, each of the plurality of driving electrode groups TG is connected to the driving line at the lower end and/or the upper end. The driving lines are connected to other display pads DPD of the sub area SBA. Therefore, the sensing lines are electrically connected to the touch driving circuit 330 through the other display pads DPD and the display circuit board 310.

Figure 10:
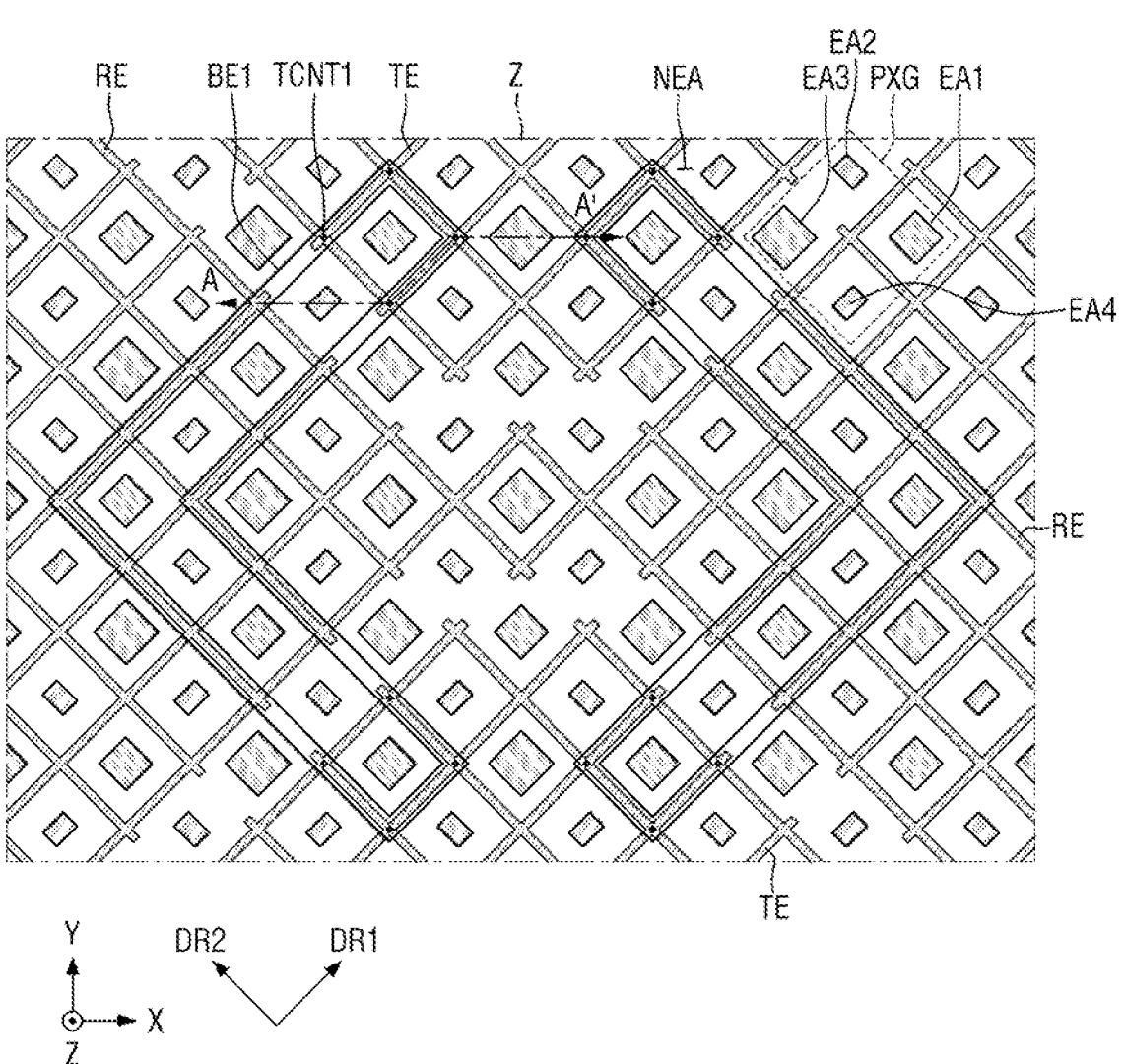
FIG. 10 is a layout diagram area Z of FIG. 9.

FIG. 10 is a layout diagram of area Z of FIG. 9.

Referring to FIG. 10, in an embodiment, since the driving electrodes TE, the sensing electrodes RE, and the dummy patterns DE are disposed on the same layer, they are spaced apart from each other. That is, a gap is formed between the driving electrode TE and the sensing electrode RE. In addition, a gap is formed between the driving electrode TE and the dummy pattern DE and between the sensing electrode RE and the dummy pattern DE.

First connection parts BE1 are disposed on a different layer from the driving electrodes TE and the sensing electrodes RE. The first connection part BE1 overlap two driving electrodes TE and one sensing electrode RE in the third direction (Z-axis direction). The two driving electrodes TE are adjacent to each other in the second direction (Y-axis direction).

The driving electrodes TE adjacent in the second direction (Y-axis direction) are connected to each other through at least one first connection part BEL One side of the first connection part BE1 is connected to one of the driving electrodes TE through a first touch contact holes TCNT1.

The other side of the first connection part BE1 is connected to another driving electrode TE through the first touch contact holes TCNT1.

The first connection part BE1 is bent at least once. In FIG. 10, the first connection part BE1 has a bracket shape ("<" or ">"), but the planar shape of the first connection part BE1 is not necessarily limited thereto. Since the driving electrodes TE adjacent to each other in the second direction (Y-axis direction) are connected by first connection parts BE1, the driving electrodes TE adjacent to each other in the second direction (Y-axis direction) are stably connected to each other even if one of the first connection parts BE1 is disconnected. FIG. 10 shows that adjacent driving electrodes TE are connected by the two first connection parts BE1, but the number of the first connection parts BE1 is not necessarily limited thereto.

The driving electrodes TE and the sensing electrodes RE are electrically separated at their intersections by the first connection parts BEL Accordingly, mutual capacitance can form between the driving electrodes TE and the sensing electrodes RE.

Each of the driving electrodes TE, the sensing electrodes RE, and the first connection parts BE1 are formed in a planar mesh or mesh structure. In addition, each of the dummy patterns DE is also formed in a planar mesh or mesh structure. For this reason, none of the driving electrodes TE, the sensing electrodes RE, the first connection parts BE1, and the dummy patterns DE overlap light emitting areas EA1, EA2, and EA3. Therefore, light emitted from the light emitting areas EA1, EA2, and EA3 is not blocked by the driving electrodes TE, the sensing electrodes RE, the first connection parts BE1, and the dummy patterns DE. Accordingly, luminance reduction of light can be prevented.

The light emitting areas EA1, EA2, EA3, and EA4 include first light emitting areas EA1 that emit first color light, second light emitting areas EA2 that emit second color light, third light emitting areas EA3 that emit third color light, and fourth light emitting areas EA4 that emit fourth color light. For example, the first color may be red, the second color and the fourth color may be green, and the third color may be blue, but embodiments of the present disclosure are not necessarily limited thereto. Each of the light emitting areas EA1, EA2, EA3, and EA4 is surrounded by a non-light emitting area NEA.

Each of the first light emitting areas EA1, the second light emitting areas EA2, the third light emitting areas EA3, and the fourth light emitting areas EA4 has a rhombus planar shape or a rectangular planar shape, but embodiments are not necessarily limited thereto. For example, each of the first light emitting areas EA1, the second light emitting areas EA2, the third light emitting areas EA3, and the fourth light emitting areas EA4 may have a polygonal, circular, or elliptical plane other than a rectangle. In addition, in FIG. 10, the third light emitting area EA3 has the largest area and the second light emitting area EA2 and the fourth light emitting area EA4 have the smallest areas, but embodiments of the present disclosure are not necessarily limited thereto.

The first light emitting area EA1, the second light emitting area EA2, the third light emitting area EA3, and the fourth light emitting area EA4 adjacent to each other may be defined as one pixel group PXG for expressing a white grayscale. For example, a white gradation is expressed by the combination of light emitted from the first light emitting area EA1, the light emitted from the second light emitting area EA2, the light emitted from the third light emitting area EA3, and the light emitted from the fourth light emitting area EA4.

The second light emitting areas EA2 and the fourth light emitting areas EA4 are disposed in odd-numbered rows. The second light emitting areas EA2 and the fourth light emitting areas EA4 are adjacent in the first direction (X-axis direction) in each of the odd-numbered rows. The second light emitting areas EA2 and the fourth light emitting areas EA4 are alternately disposed in each of the odd-numbered rows. The fourth light emitting area EA4 has a long side in one direction DR1 and a short side in another direction DR2, while the second light emitting area EA2 has a long side in the another direction DR2 and a short side in the one direction DR1. The one direction DR1 is a diagonal direction between the first direction (X-axis direction) and the second direction (Y-axis direction), and the another direction DR2 is orthogonal to the one direction DR1.

The first light emitting areas EA1 and the third light emitting areas EA3 are arranged in even rows. The first light emitting areas EA1 and the third light emitting areas EA3 are adjacent in the first direction (X-axis direction) in each of the even-numbered rows. The first light emitting areas EA1 and the third light emitting areas EA3 are alternately disposed in each of the even-numbered rows.

The second light emitting areas EA2 and the fourth light emitting areas EA4 are arranged in odd-numbered columns. The second light emitting areas EA2 and the fourth light emitting areas EA4 are adjacent in the second direction (Y-axis direction) in each of the odd-numbered columns. The second light emitting areas EA2 and the fourth light emitting areas EA4 are alternately disposed in each of odd-numbered columns.

The first light emitting areas EA1 and the third light emitting areas EA3 are arranged in even-numbered columns. The first light emitting areas EA1 and the third light emitting areas EA3 are adjacent in the second direction (Y-axis direction) in each of the even-numbered columns. The first light emitting areas EA1 and the third light emitting areas EA3 are alternately disposed in each of the even-numbered columns.

Figure 11:
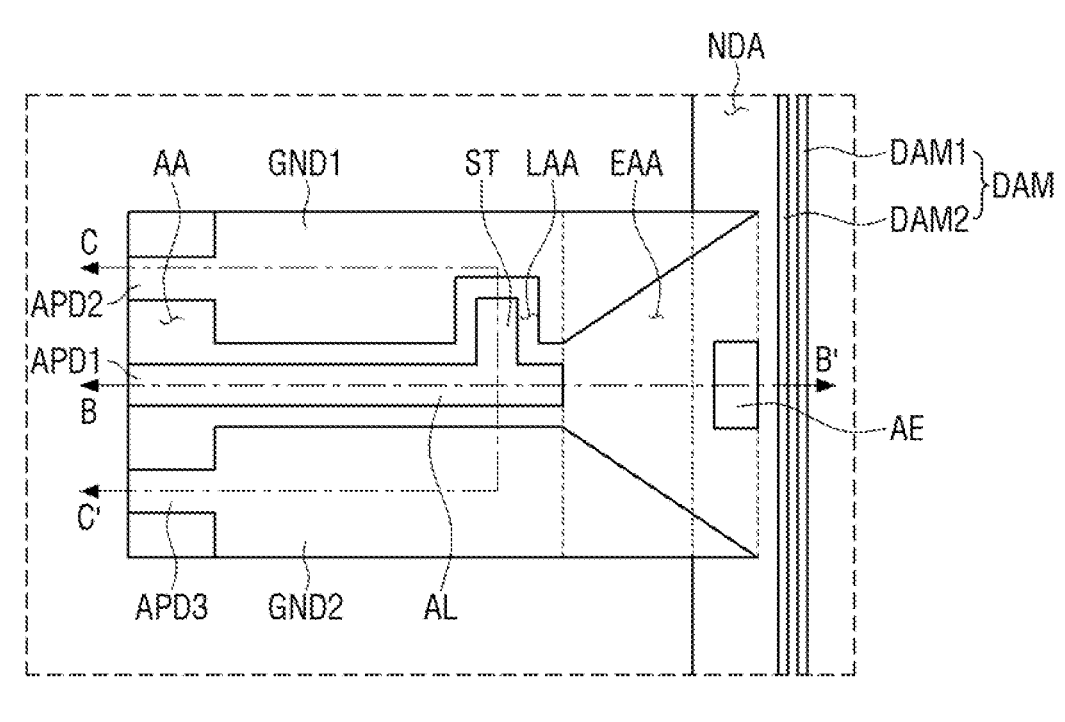
FIG. 11 is a plan view of an antenna area of FIG. 1.
Figure 11:
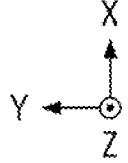
Figure 12:
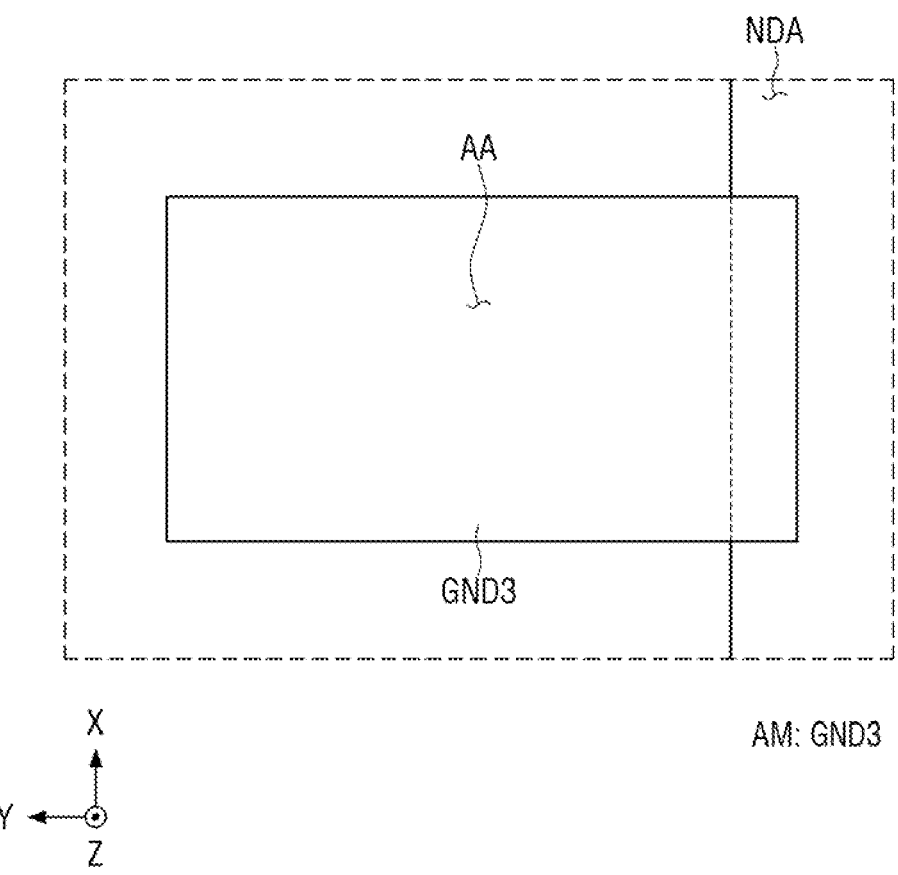
FIG. 12 is a bottom view of an antenna area of FIG. 1.

FIG. 11 is a plan view of the antenna area of FIG. 1. FIG. 12 is a bottom view of the antenna area of FIG. 1.

Referring to FIGS. 11 and 12, in an embodiment, an antenna module AM includes an antenna electrode AE, a feed line AL, a first electrode GND1, a second electrode GND2, a third electrode GND3, a first antenna pad APD1, a second antenna pad APD2, and a third antenna pad APD3.

The antenna module AM according to an embodiment is disposed in the antenna area AA and the non-display area NDA. The antenna module AM may be disposed in a feed area LAA and a radiation area EAA. The feed area LAA is a part of the antenna area AA. The radiation area EAA is a part of the non-display area NDA in the remaining area of the antenna area AA.

The feed line AL is disposed in the feed area LAA, and the antenna electrode AE is disposed in the radiation area EAA. The first electrode GND1, the second electrode GND2, and the third electrode GND3 are disposed in both the feed area LAA and the radiation area EAA. The first antenna pad APD1, the second antenna pad APD2, and the third antenna pad APD3 are disposed in the feed area LAA.

The antenna electrode AE is disposed on the upper surface of the substrate SUB. The antenna electrode AE is disposed in the non-display area NDA of the main area MA. The antenna electrode AE is disposed outside of a dam DAM in the non-display area NDA. For example, the antenna electrode AE is disposed in the non-display area NDA between the dam DAM and the edge of the substrate SUB. The dam DAM includes a first dam DAM1 and a second dam DAM2 disposed closer to the edge of the substrate SUB than the first dam DAM1. The dam DAM surrounds the display area DA.

The antenna electrode AE has a rectangular planar shape and is a parasitic patch antenna electrode that adjusts the performance of the antenna based on the influence of a lower dielectric and conductor. For example, the antenna electrode AE is not connected to the feed line AL and the antenna electrode AE id spaced apart from the feed line AL in an island pattern.

The length in the second direction (Y-axis direction) of the antenna electrode AE is less than a distance from the dam DAM to the boundary between the non-display area NDA and the antenna area AA. For example, the distance from the dam DAM to the boundary between the non-display area NDA and the antenna area AA is approximately 300 μm to minimize a bezel. For example, the length in the second direction (Y-axis direction) of the antenna electrode AE is less than or equal to 300 μm.

The length in the first direction (X-axis direction) of the antenna electrode AE depends on the frequency of the electromagnetic wave to be transmitted and received by the antenna electrode AE. The length of the antenna electrode AE in the first direction (X-axis direction) is designed to have a resonance length of half ($\lambda$g/2) of the in-pipe wavelength of the feed line AL. For example, when the frequency of the electromagnetic wave to be transmitted and received using the antenna electrode AE is about 60 GHz, the length of the antenna electrode AE in the first direction (X-axis direction) is about 2.5 mm.

The feed line AL is disposed on the upper surface of the substrate SUB. The feed line AL is disposed in the antenna area AA. An extension direction of the feed line AL is the same as an extension direction of the antenna area AA. For example, when the antenna area AA protrudes in the second direction (Y-axis direction) from the upper side of the main area MA as shown in FIGS. 1 and 2, the feed line AL extends in the second direction (Y-axis direction). Alternatively, when the antenna area AA protrudes in the first direction (X-axis direction) from the left side of the main area MA as shown in FIGS. 5 and 6 or protrudes in the first direction (X-axis direction) from the right side of the main area MA as shown in FIGS. 7 and 8, the feed line AL extends in the first direction (X-axis direction).

A stub ST protrudes from one side of the feed line AL. For example, the stub protrudes from in a direction that crosses the extension direction of the feed line AL. For example, the stub ST protrudes from the upper side of the feed line AL as shown in FIG. 11. The stub ST matches the impedance between the feed line AL and the antenna electrode AE and increases the radiation performance of the antenna by changing the phase of the radiation pattern of electromagnetic waves. For example, since the antenna area AA is bent downward from the display panel 300, the stub ST is disposed close to the radiation area EAA. For example, the stub ST is disposed closer to the end of the feed line AL adjacent to the radiation area EAA than to the end of the feed line AL adjacent to the first antenna pad APD1.

The first electrode GND1 and the second electrode GND2 are disposed on the upper surface of the substrate SUB. The first electrode GND1 and the second electrode GND2 are disposed in the antenna area AA and the non-display area NDA.

The first electrode GND1 is disposed on one side of the feed line AL and the second electrode GND2 is disposed on the other side of the feed line AL. The first electrode GND1 and the second electrode GND2 are spaced apart from the feed line AL. A ground voltage is applied to the first electrode GND1 and the second electrode GND2.

Due to the stub ST, an area of the first electrode GND1 is smaller than an area of the second electrode GND2. The area of the first electrode GND1 and the area of the second electrode GND2 are greater than an area of the feed line AL.

The radiation area EAA has a tapered slot shape for transmission and reception of broadband electromagnetic waves. For example, the distance between the first electrode GND1 and the second electrode GND2 increases from one end of the feed line AL toward the antenna electrode AE. In addition, the width of the first electrode GND1 decreases in the radiation area EAA toward one end of the first electrode GND1. For example, the width of the first electrode GND1 decreases from the boundary between the feed area LAA and the radiation area EAA toward the one end of the first electrode GND1 in the radiation area EAA. In addition, the width of the second electrode GND2 decreases in the radiation area EAA toward one end of the second electrode GND2. For example, the width of the second electrode GND2 decreases from the boundary between the feed area LAA and the radiation area EAA toward the one end of the second electrode GND2 in the radiation area.

When the radiation area EAA has a tapered slot shape, electromagnetic waves radiated from the radiation area EAA can be affected by external dielectrics and conductors since the central area of the radiation area EAA is empty. Accordingly, the influence of electromagnetic waves radiated from the feed line AL in the radiation area EAA can be reduced by the external dielectric and conductor and the impedance between the antenna electrode AE and the feed line AL can be matched by having the patch antenna electrode AE spaced apart from the feed line AL, the first electrode GND1, and the second electrode GND2 in the radiation area EAA.

The electromagnetic wave radiated from the one end of the feed line AL of the radiation area EAA propagates toward the antenna electrode AE through the insulating layers 130, 141, and 142 (see FIGS. 13 and 14, below) of the display panel 300 that correspond to the dielectric layer. The antenna electrode AE radiates electromagnetic waves from one end of the feed line AL toward the top surface of the display panel 300.

Since the antenna electrode AE, the feed line AL, the first electrode GND1, and the second electrode GND2 are formed by the same process, they are made of the same material.

The third electrode GND3 is disposed on the lower surface of the substrate SUB. The third electrode GND3 is disposed in the antenna area AA and the non-display area NDA. The third electrode GND3 is disposed on the entire the antenna area AA as shown in FIG. 12, but embodiments of the present disclosure are not necessarily limited thereto. The ground voltage is transmitted to the third electrode GND3.

The third electrode GND3 overlaps the feed line AL1, the first electrode GND1, and the second electrode GND2 in the third direction (Z-axis direction). Due to the first electrode GND1, the second electrode GND2, and the third electrode GND3, the feed line AL has a ground coplanar wave guide (GCPW) structure.

The first antenna pad APD1, the second antenna pad APD2, and the third antenna pad APD3 are disposed on the lower surface of the substrate SUB. The first antenna pad APD1, the second antenna pad APD2, and the third antenna pad APD3 are disposed at one edge of the antenna area AA.

The first antenna pad APD1 is connected to one end of the feed line AL. The first antenna pad APD1 is integrally formed with the feed line AL.

The second antenna pad APD2 is connected to one end of the second electrode GND2. The second antenna pad APD2 is integrally formed with the second electrode GND2.

The third antenna pad APD3 is connected to one end of the third electrode GND3. The third antenna pad APD3 is integrally formed with the third electrode GND3.

The first antenna pad APD1, the second antenna pad APD2, and the third antenna pad APD3 are connected to the antenna circuit board 340 using the conductive adhesive member such as the anisotropic conductive film and the anisotropic conductive adhesive.

In addition, the third electrode GND3 is also connected to the antenna pad, and is connected to the antenna circuit board 340 using the conductive adhesive member such as the anisotropic conductive film and the anisotropic conductive adhesive.

As shown FIGS. 11 and 12, the antenna module AM is formed in the antenna area AA, which protrudes from one side of the main area MA of the display panel 300, and the non-display area NDA of the main area MA adjacent to the antenna area AA. The antenna area AA is bent under the display panel 300, and only the antenna electrode AE is formed outside the dam DAM in the non-display area NDA of the main area MA as shown in FIGS. 2, 4, 6, and 8. Accordingly, a separate space is not needed for the antenna module AM in the display panel 300.

In addition, in FIGS. 11 and 12, the antenna module AM according to an embodiment uses a direct feeding method in which the radiation area EAA and the feed area LAA are directly connected, but embodiments of the present disclosure are not necessarily limited thereto. For example, an antenna module according to an embodiment uses an indirect feed method in which the antenna electrode AE is fed through a dielectric area disposed thereunder.

In addition, FIGS. 11 and 12 illustrate an embodiment in which the antenna module AM is disposed at the outer portion of the dam DAM, but the antenna electrode AE or the feed line AL may extend to the display area DA using a transparent material if the length of the antenna electrode AE or the length of the feed line AL needs to be increased.

Figure 13:
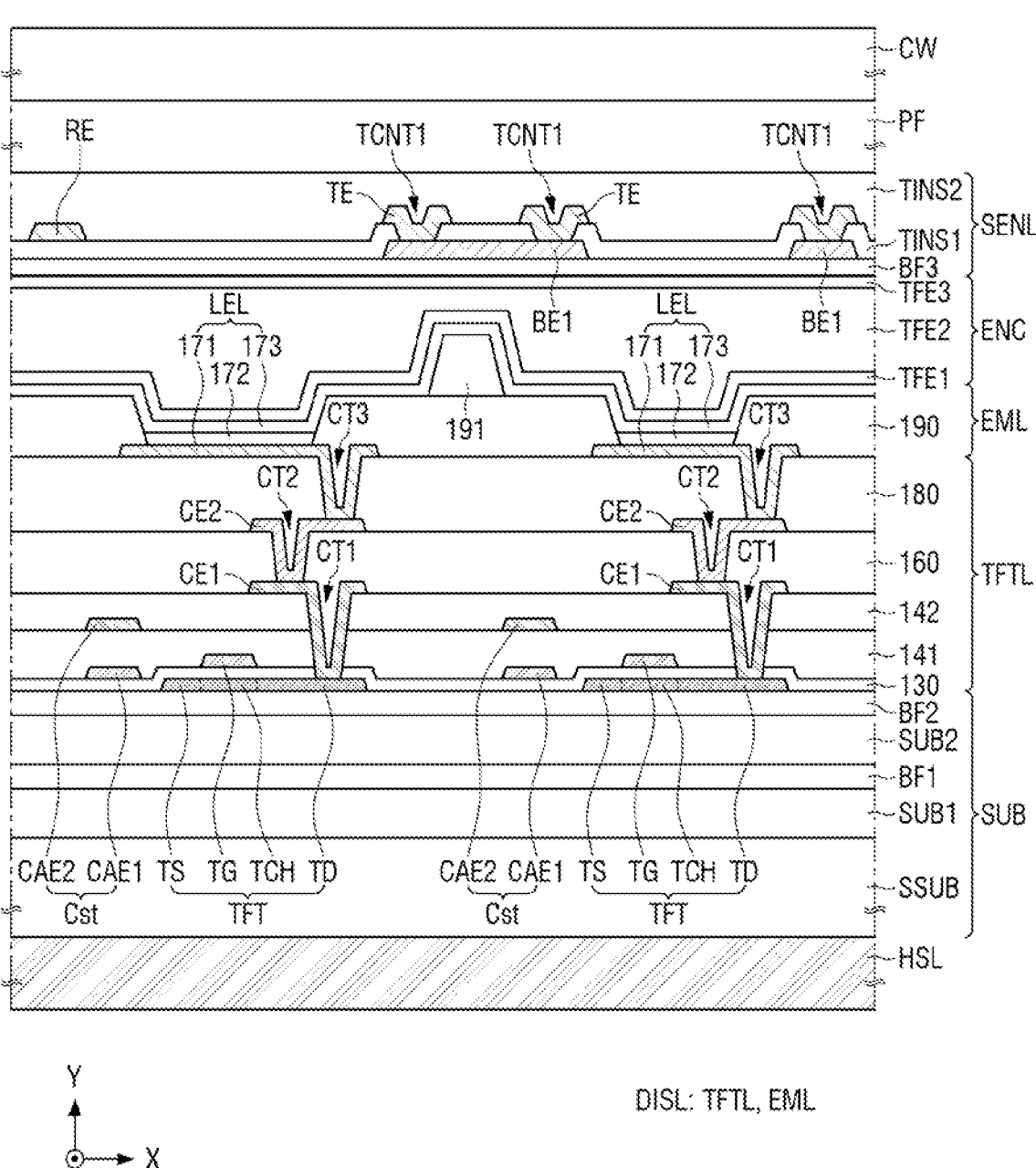
FIG. 13 is a cross-sectional view of a display device taken along line A-A' of FIG. 10.

FIG. 13 is a cross-sectional view of a display device taken along line A-A' of FIG. 10.

Referring to FIG. 13, in an embodiment, the display device includes a substrate SUB, a display layer DISL that includes a thin film transistor layer TFTL and a light emitting element layer EML disposed on one surface of the substrate SUB, an encapsulation layer ENC disposed on the display layer DISL, and a sensor electrode layer SENL that includes the sensor electrodes SE disposed on the encapsulation layer ENC. The display device further includes the polarizing film PF disposed on the sensor electrode layer SENL, and the cover window CW disposed on the polarizing film PF.

The substrate SUB includes a support substrate SSUB, a first substrate SUB1, a first buffer layer BF1, a second substrate SUB2, and a second buffer layer BF2. The first substrate SUB1 is disposed on the support substrate SSUB, the first buffer layer BF1 is disposed on the first substrate SUB1, the second substrate SUB2 is disposed on the first buffer layer BF1, and the second buffer layer BF2 is disposed on the second substrate SUB2.

The support substrate SSUB is a rigid substrate that supports the flexible first substrate SUB1 and the second substrate SUB2. The support substrate SSUB is formed of glass or a plastic material such as polycarbonate (PC) or polyethylene terephthalate (PET).

The first substrate SUB1 and the second substrate SUB2 are formed of organic material such as at least one of acrylic resin, epoxy resin, phenolic resin, polyamide resin, or polyimide resin. The first substrate SUB1 and the second substrate SUB2 may be formed of the same organic material or from different organic materials.

Each of the first buffer layer BF1 and the second buffer layer BF2 is formed of an inorganic material such as at least one of a silicon nitride layer, a silicon oxynitride layer, a silicon oxide layer, a titanium oxide layer, or an aluminum oxide layer. Alternatively, each of the first buffer layer BF1 and the second buffer layer BF2 has a multilayer structure in which a plurality of layers that include one or more of a silicon nitride layer, a silicon oxynitride layer, a silicon oxide layer, a titanium oxide layer, or an aluminum oxide layer are alternately stacked. The first buffer layer BF1 and the second buffer layer BF2 may be formed of the same inorganic material or from different inorganic materials.

The thin film transistor layer TFTL is formed on the substrate SUB and includes a thin film transistor TFT, a capacitor Cst, connection electrodes CE1, CE2, and insulating layers 130, 141, 142, 160 and 180. An active layer that includes a channel area TCH, a source area TS, and a drain area TD of the thin film transistor TFT is disposed on the second buffer layer BF2. The active layer includes at least one of a polycrystalline silicon, a single crystal silicon, a low-temperature polycrystalline silicon, amorphous silicon, or an oxide semiconductor material. When the active layer includes polycrystalline silicon or an oxide semiconductor material, the source area TS and the drain area TD are conductive areas doped with ions to be conductive.

A gate insulating layer 130 is formed on the second buffer layer BF2 and the active layer of the thin film transistor TFT. The gate insulating layer 130 is formed of an inorganic layer, such as on eof a silicon nitride layer, a silicon oxynitride layer, a silicon oxide layer, a titanium oxide layer, or an aluminum oxide layer.

A gate electrode TG and a first capacitor electrode CAE1 of the thin film transistor TFT are disposed on the gate insulating layer 130. The gate electrode TG of the thin film transistor TFT overlaps the channel area TCH in the third direction (Z-axis direction). The gate electrode TG and the first capacitor electrode CAE1 may be formed as a single layer or as multiple layers that include one or more of molybdenum (Mo), aluminum (Al), chromium (Cr), gold (Au), titanium (Ti), nickel (Ni), neodymium (Nd), or copper (Cu) or an alloy thereof.

A first interlayer insulating layer 141 may be disposed on the gate insulating layer 130 and the gate electrode TG and the first capacitor electrode CAE1. The first interlayer insulating layer 141 is formed of an inorganic layer, such as one of a silicon nitride layer, a silicon oxynitride layer, a silicon oxide layer, a titanium oxide layer, or a aluminum oxide layer. The first interlayer insulating layer 141 may include a plurality of inorganic layers.

A second capacitor electrode CAE2 is disposed on the first interlayer insulating layer 141. The second capacitor electrode CAE2 overlaps the first capacitor electrode CAE1 in the third direction (Z-axis direction). Therefore, the capacitor Cst is formed of the first interlayer insulating layer 141 serving as a dielectric layer disposed between the first capacitor electrode CAE1 and the second capacitor electrode CAE2. The second capacitor electrode CAE2 may be formed as a single layer or as multiple layers that include one or more of molybdenum (Mo), aluminum (Al), chromium (Cr), gold (Au), titanium (Ti), nickel (Ni), neodymium (Nd), or copper (Cu) or an alloy thereof.

A second interlayer insulating layer 142 is disposed on the first interlayer insulating layer 141 and the second capacitor electrode CAE2. The second interlayer insulating layer 142 is formed of an inorganic layer, such as one of a silicon nitride layer, a silicon oxynitride layer, a silicon oxide layer, a titanium oxide layer, or an aluminum oxide layer. The second interlayer insulating layer 142 may include the plurality of inorganic layers.

A first connection electrode CE1 is disposed on the second interlayer insulating layer 142. The first connection electrode CE1 is connected to the drain area TD through a first contact hole CT1 that penetrates the gate insulating layer 130, the first interlayer insulating layer 141, and the second interlayer insulating layer 142. The first connection electrode CE1 may be formed as a single layer or as multiple layers that include one or more of molybdenum (Mo), aluminum (Al), chromium (Cr), gold (Au), titanium (Ti), nickel (Ni), neodymium (Nd), or copper (Cu) or an alloy thereof.

A first organic layer 160 that flattens steps caused by the thin film transistors TFT may be disposed on the second interlayer insulating layer 142 and the first connection electrode CE1. The first organic layer 160 is formed of an organic layer such as one of an acryl resin, an epoxy resin, a phenolic resin, a polyamide resin, or a polyimide resin, etc.

A second connection electrode CE2 is disposed on the first organic layer 160. The second connection electrode CE2 is connected to the first connection electrode CE1 through a second contact hole CT2 that penetrates the first organic layer 160. The second connection electrode CE2 may be formed as a single layer or as multiple layers that include one or more of of molybdenum (Mo), aluminum (Al), chromium (Cr), gold (Au), titanium (Ti), nickel (Ni), neodymium (Nd), or copper (Cu) or an alloy thereof.

A second organic layer 180 is disposed on first organic layer 160 and the second connection electrode CE2. The second organic layer 180 is formed of an organic layer such as an acryl resin, an epoxy resin, a phenolic resin, a polyamide resin, or a polyimide resin, etc.

The light emitting element layer EML is disposed on the thin film transistor layer TFTL. The light emitting element layer EML includes light emitting elements LEL and a bank 190.

Each of the light emitting elements LEL includes a pixel electrode 171, a light emitting layer 172, and a common electrode 173 that are sequentially stacked. Each of the light emitting areas EA1, EA2, EA3, and EA4 represents an area where holes from the pixel electrode 171 and electrons from the common electrode 173 combine with each other in the light emitting layer 172 to emit light. The pixel electrode 171 may be an anode electrode and the common electrode 173 may be a cathode electrode.

The pixel electrode 171 is formed on the second organic layer 180. The pixel electrode 171 is connected to a second connection electrode CE2 through a third contact hole CT3 that penetrates the second organic layer 180.

In a top emission structure in which the the emitting layer 172 emits light in the direction of the common electrode 173, the pixel electrode 171 may be a single layer that includes one of molybdenum (Mo), titanium (Ti), copper (Cu), or aluminum (Al), or may be one of a stacked structure of aluminum and titanium (Ti/Al/Ti), a stacked structure of aluminum and ITO (ITO/Al/ITO), an APC alloy, or a stacked structure of an APC alloy and ITO (ITO/APC/ITO) to increase reflectivity. The APC alloy is an alloy of silver (Ag), palladium (Pd), and copper (Cu).

The bank 190 is disposed on the second organic layer 180 and defines the emitting areas EA1, EA2, EA3, and EA4 of the display pixels. The bank 190 exposes a partial area of the pixel electrode 171. The bank 190 covers the edge of the pixel electrode 171. The bank 190 extends into a contact hole penetrating the second organic layer 180. Accordingly, the third contact hole CT3 that penetrates through the second organic layer 180 is filled by the bank 190. The bank 190 is formed of an organic layer such as one of an acrylic resin, an epoxy resin, a phenolic resin, a polyamide resin, or a polyimide resin.

A spacer 191 is disposed on the bank 190. The spacer 191 support a mask during a process of manufacturing the light emitting layer 172. The spacer 191 is formed of an organic layer such as one of an acrylic resin, an epoxy resin, a phenolic resin, a polyamide resin, or a polyimide resin.

The light emitting layer 172 is formed on the pixel electrode 171. The light emitting layer 172 includes an organic material that emits a predetermined color. For example, the light emitting layer 172 includes a hole transporting layer, an organic material layer, and an electron transporting layer. The organic material layer includes a host and a dopant. The organic material layer includes a material that emits a predetermined color of light and is formed using a phosphorescent material or a fluorescent material.

For example, the organic material layer of the light emitting layer 172 of the first light emitting area EA1 that emits first color light includes a host material that contains one of CBP (carbazole biphenyl) or mCP (1,3-bis(carbazol-9-yl) and a phosphorescent material that includes a dopant that contains at least one of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) or PtOEP(octaethylporphyrin platinum). Alternatively, the organic material layer of the emitting layer 172 of the first emitting area EA1 is a fluorescent material that includes PBD:Eu(DBM)3(Phen) or Perylene, but is not necessarily limited thereto.

The organic material layer of the emitting layer 172 of the second emitting area EA2 and the fourth emitting area EA4 that emits second color light includes a host material that includes one of CBP or mCP and a phosphorescent material that includes a dopant that contains Ir(ppy)3(fac tris(2-phenylpyridine)iridium). Alternatively, the organic material layer of the light emitting layer 172 of the second light emitting area EA2 and the fourth light emitting area EA4 that emits second color light is a fluorescent material that includes Alq3(tris(8-hydroxyquinolino)aluminum), but is not necessarily limited thereto.

The organic material layer of the emitting layer 172 of the third emitting area EA3 that emits third color light includes a host material that includes one of CBP or mCP and a phosphorescent material that includes a dopant that contains one of (4,6-F2ppy)2Irpic or L2BD111, but is not necessarily limited thereto.

The common electrode 173 is formed on the emitting layer 172. The common electrode 173 covers the emitting layer 172. The common electrode 173 is a common layer that is commonly formed in the emitting areas EA1, EA2, EA3, and EA4. A capping layer is formed on the common electrode 173.

The common electrode 173 is formed of a transparent conductive material (TCO) such as one of ITO or IZO that transmits light, or is formed of a semi-transmissive conductive material such as one of magnesium (Mg), silver (Ag), or an alloy of magnesium (Mg) and silver (Ag). When the common electrode 173 is a transflective metal material, light output efficiency is increased by micro cavities.

The encapsulation layer ENC is formed on the light emitting elements layer EML. The encapsulation layer ENC includes at least one inorganic layer TFE1 and TFE3 that prevent oxygen or moisture from penetrating into the light emitting element layer EML. In addition, the encapsulation layer ENC includes at least one organic layer TFE2 that protects the light emitting element layer EML from foreign substances such as dust. For example, the encapsulation layer ENC includes a first inorganic encapsulation layer TFE1, an organic encapsulation layer TFE2, and a second inorganic encapsulation layer TFE3.

The first inorganic encapsulation layer TFE1 is disposed on the common electrode 173, the organic encapsulation layer TFE2 is disposed on the first inorganic encapsulation layer TFE1, and the second inorganic encapsulation layer TFE3 is disposed on the organic encapsulation layer TFE2. The first inorganic encapsulation layer TFE1 and the second inorganic encapsulation layer TFE3 may be formed as a multilayer structure in which one or more of a silicon nitride layer, a silicon oxynitride layer, a silicon oxide layer, a titanium oxide layer, or an aluminum oxide layer are alternately stacked. The organic encapsulation film TFE2 is an organic film that includes at least one of an acrylic resin, an epoxy resin, a phenolic resin, a polyamide resin, or a polyimide resin.

The sensor electrode layer SENL is disposed on the encapsulation layer ENC. The sensor electrode layer SENL includes a third buffer layer BF3, a first sensor insulating layer TINS1, a second sensor insulating layer TINS2, the sensor electrodes SE and first connection parts BE1.

The third buffer layer BF3 is disposed on the encapsulation layer ENC. The third buffer layer BF3 has an insulating and optical function. The third buffer layer BF3 includes at least one inorganic layer. For example, the third buffer layer BF3 has a multilayer structure in which one or more of a silicon nitride layer, a silicon oxynitride layer, a silicon oxide layer, a titanium oxide layer, or an aluminum oxide layer are alternately stacked. The third buffer layer BF3 can be formed by one of a lamination process that uses using a flexible material, a spin coating process that uses a solution-type material, a slit die coating process, or a deposition process. In an embodiment, the third buffer layer BF3 is omitted.

First connection parts BE1 are disposed on the third buffer layer BF3. The first connection parts BE1 may be formed of a single layer of molybdenum (Mo), titanium (Ti), copper (Cu), or aluminum (Al), or may be formed of one of a stacked structure of aluminum and titanium (Ti/Al/Ti), a stacked structure of aluminum and ITO (ITO/Al/ITO), an APC alloy, or a stacked structure of APC alloy and ITO (ITO/APC/ITO).

The first sensor insulating layer TINS1 is disposed on the first connection parts BE1. The first sensor insulating layer TINS1 has an insulating and optical function. The first sensor insulating layer TINS1 is formed of an inorganic layer, such as one of a silicon nitride layer, a silicon oxynitride layer, a silicon oxide layer, a titanium oxide layer, or an aluminum oxide layer. The first sensor insulating layer TINS1 is formed by one of a lamination process that uses a flexible material, a spin coating process that uses a solution-type material, a slit die coating process, or a deposition process.

The sensor electrodes SE, such as driving electrodes TE and sensing electrodes RE, are disposed on the first sensor insulating layer TNIS1. In addition, the dummy patterns DE are disposed on the first sensor insulating layer TNIS1. The driving electrodes TE, the sensing electrodes RE, and the dummy patterns DE do not overlap the emitting areas EA1, EA2, EA3, and EA4. The driving electrodes TE, the sensing electrodes RE, and the dummy patterns DE may be formed of a single layer of one of molybdenum (Mo), titanium (Ti), copper (Cu), or aluminum (Al), or may be one of a stacked structure of aluminum and titanium (Ti/Al/Ti), a stacked structure of aluminum and ITO (ITO/Al/ITO), an APC alloy, or a stacked structure of APC alloy and ITO (ITO/APC/ITO).

The second sensor insulating layer TINS2 is disposed on the driving electrodes TE, the sensing electrodes RE, and the dummy patterns DE. The second sensor insulating layer TINS2 has an insulating and optical function. The second sensor insulating layer TINS2 includes at least one of an inorganic layer or an organic layer. The inorganic layer is one of a silicon nitride layer, a silicon oxynitride layer, a silicon oxide layer, a titanium oxide layer, or an aluminum oxide layer. The organic layer includes one of an acrylic resin, an epoxy resin, a phenolic resin, a polyamide resin, or a polyimide resin. The second sensor insulating layer TINS2 is formed by one of a lamination process that uses a flexible material, a spin coating process that uses a solution-type material, a slit die coating process, or a deposition process.

The heat dissipation layer HSL of the panel bottom cover PB is disposed on the lower surface of the support substrate SSUB of the substrate SUB. The heat dissipation layer HSL is formed of a thin metal film such as one of copper, nickel, ferrite, or silver that can shield electromagnetic waves and is thermally conductive.

Figure 14:
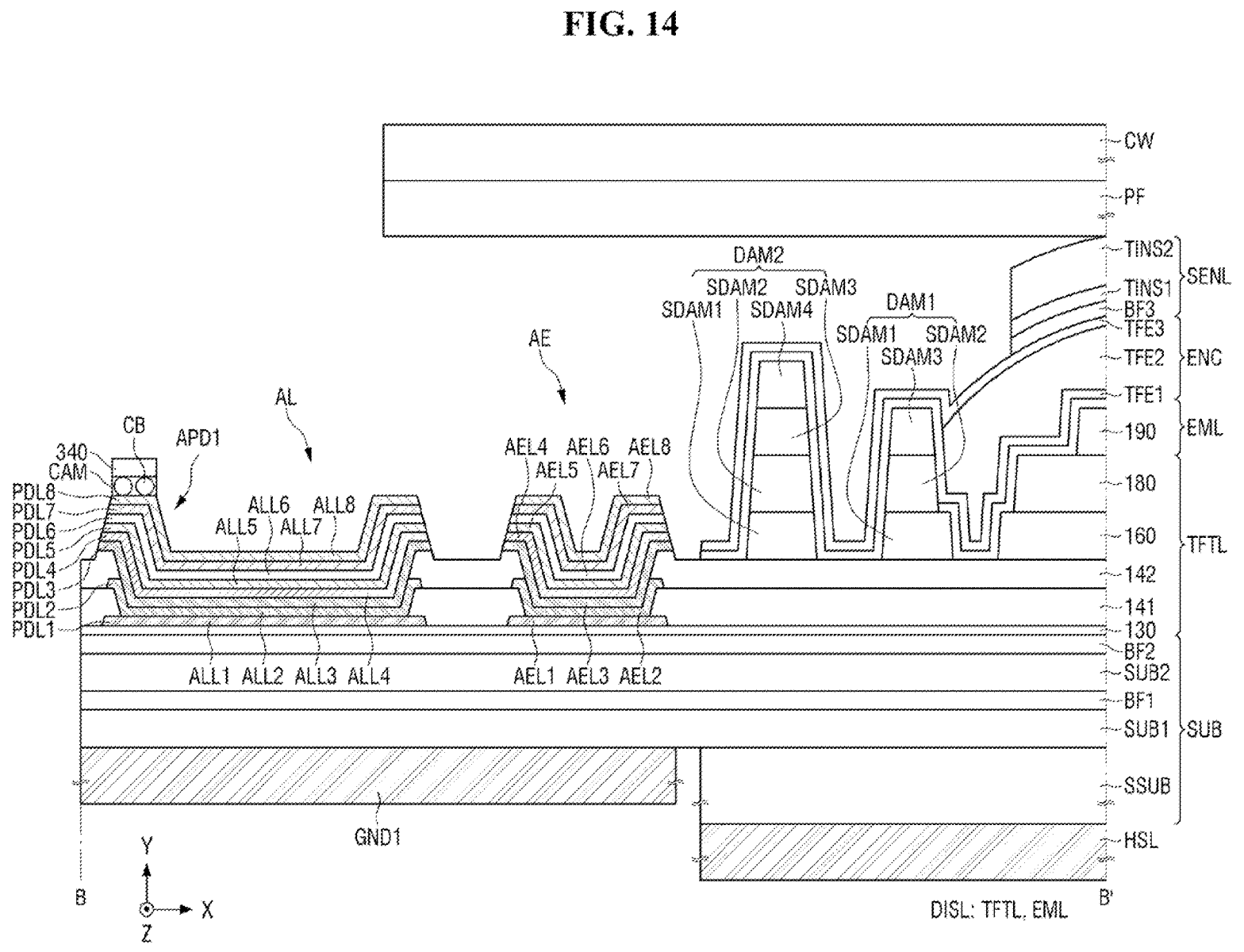
Figure 15:
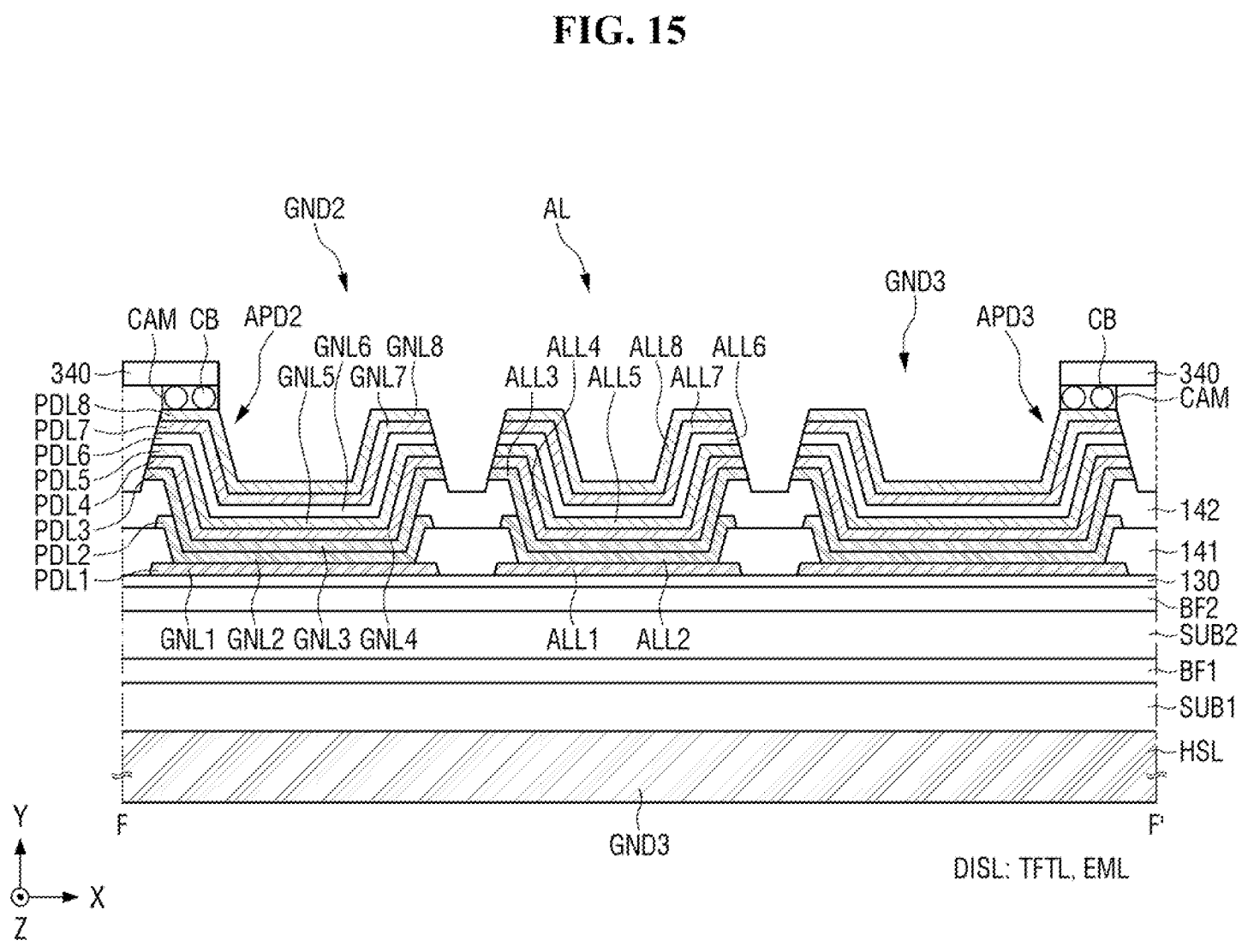

FIG. 14 is a cross-sectional view of a display device taken along line B-B' of FIGS. 11 and 12. FIG. 15 is a cross-sectional view of a display device taken along line C-C' of FIGS. 11 and 12.

Referring to FIGS. 14 and 15, in an embodiment, the dam DAM that surrounds the display area DA is disposed in the non-display area NDA of the display panel 300. The dam DAM prevents an overflow of the organic encapsulation layer TFE2 of the encapsulation layer ENC. The dam DAM includes a first dam DAM1 and a second dam DAM2 disposed outside the first dam DAM1. The first dam DAM1 and the second dam DAM2 are disposed on the second interlayer insulating layer 142.

The first dam DAM1 includes a first sub-dam SDAM1, a second sub-dam SDAM2, and a third sub-dam SDAM3 that are sequentially stacked. The first sub-dam SDAM1 is formed of the same material as the first organic layer 160, the second sub-dam SDAM2 is formed of the same material as the second organic layer 180, and the third sub-dam SDAM3 is formed of the same material as the bank 190.

The second dam DAM2 includes the first sub-dam SDAM1, the second sub-dam SDAM2, the third sub-dam SDAM3, and a fourth sub-dam SDAM4 that are sequentially stacked. The first sub-dam SDAM1 is formed of the same material as the first organic layer 160 and the second sub-dam SDAM2 is formed of the same material as the second organic layer 180. The third sub-dam SDAM3 is formed of the same material as the bank 190 and the fourth sub-dam SDAM4 is formed of the same material as the spacer 191.

The antenna electrode AE includes first to eighth antenna electrode layers AEL1 to AEL8 that are sequentially stacked on the gate insulating layer 130. However, embodiments of the present disclosure are not necessarily limited thereto, and in other embodiments, the antenna electrode AE includes only some of antenna electrode layers AEL1 to AEL8.

A first antenna electrode layer AEL1 is disposed on the gate insulating layer 130 and is formed by the same process as the gate electrode TG and the first capacitor electrode CAE1 of the thin film transistor TFT and is formed of the same material. An edge of the first antenna electrode layer AEL1 is covered by the first interlayer insulating layer 141.

A second antenna electrode layer AEL2 is disposed on the exposed first antenna electrode layer AEL1 without being covered by the first interlayer insulating layer 141. The second antenna electrode layer AEL2 is formed by the same process as the second capacitor electrode CAE2 and is formed of the same material. An edge of the second antenna electrode layer AEL2 is covered by the second interlayer insulating layer 142.

A third antenna electrode layer AEL3 is disposed on the exposed second antenna electrode layer AEL2 without being covered by the second interlayer insulating layer 142. The third antenna electrode layer AEL3 is formed by the same process as the first connection electrode CE1 and is formed of the same material.

A fourth antenna electrode layer AEL4 is disposed on the third antenna electrode layer AEL3. The fourth antenna electrode layer AEL4 is formed by the same process as the second connection electrode CE2 and is formed of the same material.

A fifth antenna electrode layer AEL5 is disposed on the fourth antenna electrode layer AEL4. The fifth antenna electrode layer AEL5 is formed by the same process as the pixel electrode 171 and is formed of the same material.

A sixth antenna electrode layer AEL6 is disposed on the fifth antenna electrode layer AEL5. The sixth antenna electrode layer AEL6 is formed by the same process as the common electrode 173 and is formed of the same material.

A seventh antenna electrode layer AEL7 is disposed on the sixth antenna electrode layer AEL6. The seventh antenna electrode layer AEL7 is formed by the same process as the first connection part BE1 of the sensor electrode layer SENL and is formed of the same material.

An eighth antenna electrode layer AEL8 is disposed on the seventh antenna electrode layer AEL7. The eighth antenna electrode layer AEL8 is formed by the same process as the driving electrode TE, the sensing electrode RE, and the dummy pattern DE of the sensor electrode layer SENL and is formed of the same material.

The feed line AL includes first to eighth feed line layers ALL1 to ALL8 that are sequentially stacked on the gate insulating layer 130. However, embodiments of the present disclosure are not necessarily limited thereto, and in other embodiments, the feed line AL includes only some of the first to eighth feed line layers ALL1 to ALL8.

The first to eighth feed line layers ALL1 to ALL8 are integrally formed with the first to eighth antenna electrode layers AEL1 to AEL8. For example, the first to eighth feed line layers ALL1 to ALL8 have substantially the same structure as the first to eighth antenna electrode layers AEL1 to AEL8. Therefore, a description of the first to eighth feed line layers ALL1 to ALL8 will be omitted.

Each of the first electrode GND1 and the second electrode GND2 includes first to eighth electrode layers GNL1 to GNL8 that are sequentially stacked on the gate insulating layer 130. However, embodiments of the present disclosure are not necessarily limited thereto, and in other embodiments, each of the first electrode GND1 and the second electrode GND2 includes only some of the first to eighth electrode layers GNL1 to GNL8.

A first electrode layer GNL1 is formed by the same process as the gate electrode TG, the first capacitor electrode CAE1 of the thin film transistor TFT and the first antenna electrode layer AEL1 and is formed of the same material. An edge of the first electrode layer GNL1 is covered by the first interlayer insulating layer 141.

A second electrode layer GNL2 is disposed on the exposed first electrode layer GNL1 without being covered by the first interlayer insulating layer 141. The second electrode layer GNL2 is formed by the same process as the second capacitor electrode CAE2 and the second antenna electrode layer AEL2 and is formed of the same material. An edge of the second electrode layer GNL2 is covered by the second interlayer insulating layer 142.

A third electrode layer GNL3 is disposed on the exposed second electrode layer GNL2 without being covered by the second interlayer insulating layer 142. The third electrode layer GNL3 is formed by the same process as the first connection electrode CE1 and the third antenna electrode layer AEL3 and is formed of the same material.

A fourth electrode layer GNL4 is disposed on the third electrode layer GNL3. The fourth electrode layer GNL4 is formed by the same process as the second connection electrode CE2 and the fourth antenna electrode layer AEL4 and includes the same material.

A fifth electrode layer GNL5 is disposed on the fourth electrode layer GNL4. The fifth electrode layer GNL5 is formed by the same process as the pixel electrode 171 and the fifth antenna electrode layer APL5 and is formed of the same material.

A sixth electrode layer GNL6 is disposed on the fifth electrode layer GNL5. The sixth electrode layer GNL6 is formed by the same process as the common electrode 173 and the sixth antenna electrode layer APL6 and is formed of the same material.

A seventh electrode layer GNL7 is disposed on the sixth electrode layer GNL6. The seventh electrode layer GNL7 is formed by the same process as the first connection part BE1 of the sensor electrode layer SENL and the seventh antenna electrode layer APL7 and is formed of the same material.

An eighth electrode layer GNL8 is disposed on the seventh electrode layer GNL7. The eighth electrode layer GNL8 is formed by the same process as the driving electrode TE, the sensing electrode RE, and the dummy pattern DE of the sensor electrode layer SENL, and the eighth antenna electrode layer APL8, and is formed of the same material.

Each of the first antenna pad APD1, the second antenna pad APD2, and the third antenna pad APD3 includes first to eighth pad electrode layers PDL1 to PDL8 that are sequentially stacked on the gate insulating layer 130. However, embodiments of the present disclosure are not necessarily limited thereto, and in other embodiments, each of the first antenna pad APD1_1, the second antenna pad APD2_1, and the third antenna pad APD3_1 includes only some of the first to eighth pad electrode layers PDL1 to PDL8.

A first pad electrode layer PDL1 is formed by the same process as the gate electrode TG and the first capacitor electrode CAE1 of the thin film transistor TFT, the first antenna electrode layer AEL1, and the first electrode layer GNL1 and is formed of the same material. An edge of the first pad electrode layer PDL1 is covered by the first interlayer insulating layer 141.

A second pad electrode layer PDL2 is disposed on the exposed first pad electrode layer PDL1 without being covered by the first interlayer insulating layer 141. The second pad electrode layer PDL2 is formed by the same process as the second capacitor electrode CAE2, the second antenna electrode layer AEL2, and the second electrode layer GNL2 and is formed of the same material. An edge of the second pad electrode layer PDL2 is covered by the second interlayer insulating layer 142.

A third pad electrode layer PDL3 is disposed on the exposed second pad electrode layer PDL2 without being covered by the second interlayer insulating layer 142. The third pad electrode layer PDL3 is formed by the same process as the first connection electrode CE1, the third antenna electrode layer AEL3, and the third electrode layer GNL3 and is formed of the same material.

A fourth pad electrode layer PDL4 is disposed on the third pad electrode layer PDL3. The fourth pad electrode layer PDL4 is formed by the same process as the second connection electrode CE2, the fourth antenna electrode layer AEL4, and the fourth electrode layer GNL4 and is formed of the same material.

A fifth pad electrode layer PDL5 is disposed on the fourth pad electrode layer PDL4. The fifth pad electrode layer PDL5 is formed by the same process as the pixel electrode 171, the fifth antenna electrode layer APL5, and the fifth electrode layer GDL5 and is formed of the same material.

A sixth pad electrode layer PDL6 is disposed on the fifth pad electrode layer PDL5. The sixth pad electrode layer PDL6 is formed by the same process as the common electrode 173, the sixth antenna electrode layer APL6, and the sixth electrode layer GNL6 and is formed of the same material.

A seventh pad electrode layer PDL7 is disposed on the sixth pad electrode layer PDL6. The seventh pad electrode layer PDL7 is formed by the same process as the first connection part BE1 of the sensor electrode layer SENL, the seventh antenna electrode layer APL7, and the seventh electrode layer GNL7 and is formed of the same material.

An eighth pad electrode layer PDL8 is disposed on the seventh pad electrode layer PDL7. The eighth pad electrode layer PDL8 is formed by the same process as the driving electrode TE, the sensing electrode RE, and the dummy pattern DE of the sensor electrode layer SENL, the eighth antenna electrode layer APL8, and the eighth electrode layer GNL8 and is formed of the same material.

The third electrode GND3 is disposed on the lower surface of the first substrate SUB1 of the substrate SUB. Since the antenna area AA is bent and disposed under the main area MA, the support substrate SSUB of the substrate SUB can be removed from the antenna area AA.

The third electrode GND3 is formed of the same material as the heat dissipation layer HSL of the panel bottom cover PB. The thickness of the third electrode GND3 is greater than the thickness of each of the antenna electrode AE, the feed line AL, the first electrode GND1, the second electrode GND2, the first antenna pad APD1, the second antenna pad APD2, and the third antenna pad APD3. Therefore, the thickness of the third electrode GND3 is greater than the sum of the thicknesses of the first to eighth antenna electrode layers AEL1 to AEL8 of the antenna electrode AE. In addition, the thickness of the third electrode GND3 is greater than the sum of the thicknesses of the first to eighth feed line layers ALL1 to ALL8 of the feed line AL. In addition, the thickness of the third electrode GND3 is greater than the sum of the thicknesses of the first to eighth electrode layers GNL1 to GNL8 of each of the first electrode GND1 and the second electrode GND2. In addition, the thickness of the third electrode GND3 is greater than the sum of the thicknesses of the first to eighth pad electrode layers PDL1 to PDL8 of each of the first antenna pad APD1, the second antenna pad APD2, and the third antenna pad APD3.

Further, the thickness of the antenna electrode AE, the thickness of the feed line AL, the thickness of the first electrode GND1, the thickness of the second electrode GND2, the thickness of the first antenna pad APD1, the thickness of the second antenna pad APD2 and the thickness of the third antenna pad APD3 are the same.

As shown in FIGS. 14 and 15, there is no need to add separate processes to form the antenna electrode AE, the feed line AL, the first electrode GND1, the second electrode GND2, the first antenna pad APD1, the second antenna pad APD2, and third antenna pad APD3. The first to eighth antenna electrode layers AEL1 to AEL8 of the antenna electrode AE, the first to eighth feed line layers ALL1 to ALL8 of the feed line AL, the first to eighth electrode layers GNL1 to GNL8 of each of the first electrode GND1 and the second electrode GND2, the first to eighth pad electrode layers PDL1 to PDL8 of each of the first antenna pad APD1, the second antenna pad APD2, and the third antenna pad APD3 are formed with the same material in the same process as the electrodes of the thin film transistor layer TFTL, the light emitting device layer EML, and the sensor electrode layer SENL.

In addition, since the third electrode GND3 is formed of the same material as the heat dissipation layer HSL of the panel bottom cover PB, there is no need to add a separate process to form the third electrode GND3.

Figure 16:
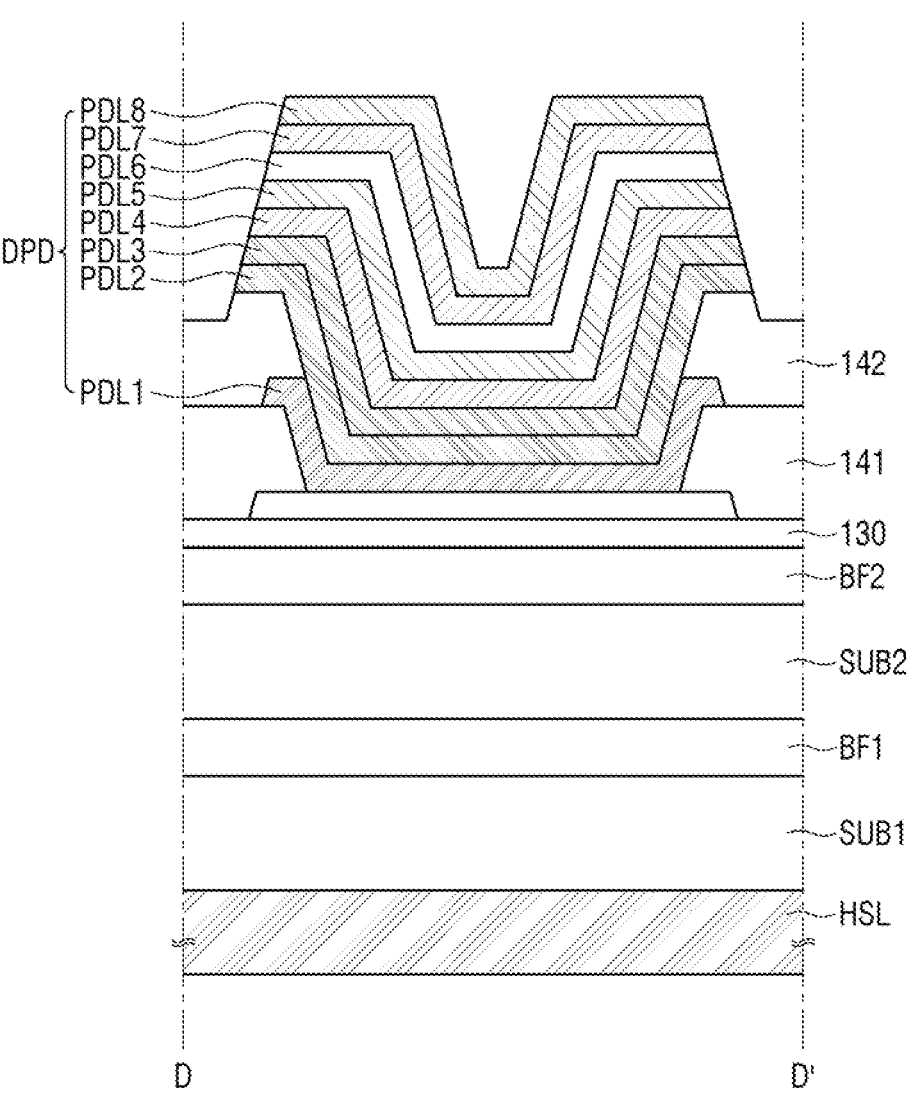
FIG. 16 is a cross-sectional view of a display device taken along line D-D' of FIG. 1.

FIG. 16 is a cross-sectional view of a display device taken along line D-D' of FIG. 1.

Referring to FIG. 16, in an embodiment, each of the display pads DPD includes first to eighth pad electrode layers PDL1 to PDL8 that are sequentially stacked on the gate insulating layer 130. However, embodiments of the present disclosure are not necessarily limited thereto, and in other embodiments, each of the display pads DPD include only some of the first to eighth pad electrode layers PDL1 to PDL8.

The first to eighth pad electrode layers PDL1 to PDL8 of each of the display pads DPD have substantially the same structure as the first to eighth pad electrode layers PDL1 to PDL8 of the first antenna pad APD1, the second antenna pad APD2, and the third antenna pad APD3, respectively described with reference to FIGS. 14 and 15. Therefore, a description of the first to eighth pad electrode layers PDL1 to PDL8 of each of the display pads DPD will be omitted.

As shown in FIG. 16, since the antenna electrode AE, the feed line AL, the first electrode GND1, the second electrode GND2, the first antenna pad APD1, the second antenna pad APD2, and the third antenna pad APD3 have substantially the same structure as the display pads DPD, there is no need to add separate processes to form the antenna electrode AE, the feed line AL, the first electrode GND1, the second electrode GND2, the first antenna pad APD1, the second antenna pad APD2, and the third antenna pad APD3 by forming.

Figure 17:
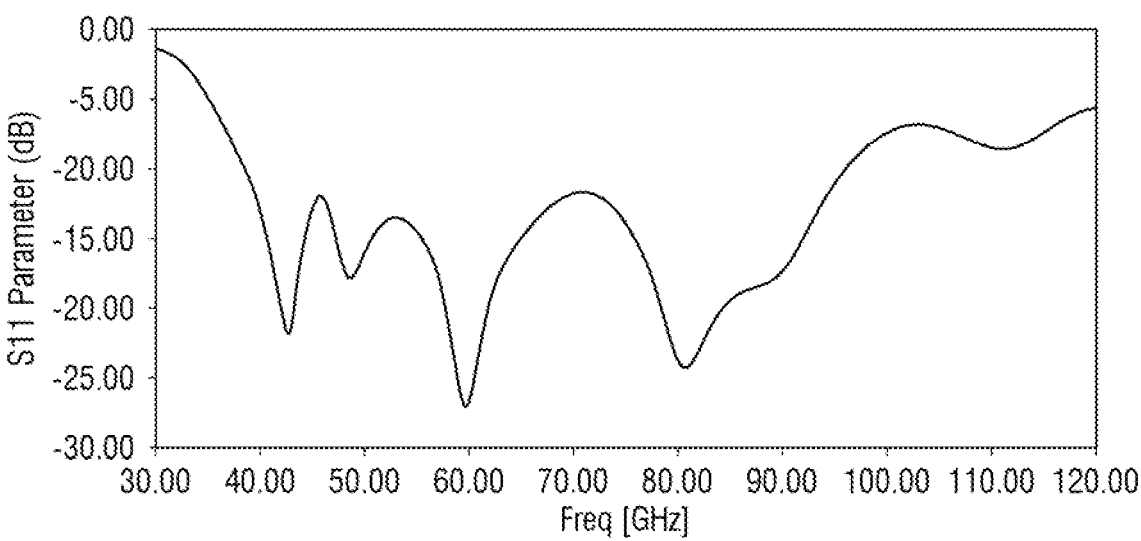
FIG. 17 is a graph of a reflection coefficient of an antenna module as a function of a frequency of the antenna module according to one or more embodiments.

FIG. 17 is a graph of a reflection coefficient of an antenna module as a function of a frequency of the antenna module according to one or more embodiments.

In FIG. 17, the X-axis represents frequency (GHz), and the Y-axis represents S11, which is a value that represents the ratio of the magnitude of the input signal to the magnitude of a signal that is reflected from the input signal, hereinafter referred to as the reflection signal. S11 is a reflection coefficient of the antenna module AM, and the unit are dB.

The operation of the antenna module AM can be determined based on a case in which the value of S11 is negative. When S11 has a negative value, the magnitude of the reflection signal is less than that of the input signal. The smaller the value of S11, the smaller the reflected and returned signal is, and the antenna module AM operates in a corresponding frequency band.

Referring to FIG. 17, the antenna module AM according to an embodiment has a minimum value of −27 dB at approximately 59 GHz. Therefore, the antenna module AM according to an embodiment optimally operates at 59 GHz.

Since the frequency band in which the S11 value of the antenna module AM according to an embodiment is less than or equal to −10 dB is approximately 39 to 96 GHz, the −10 dB impedance bandwidth of the antenna module AM according to the embodiment is approximately 57 GHz. Thus, the antenna module AM embedded in the display panel 300 has a wide bandwidth.

Figure 18:
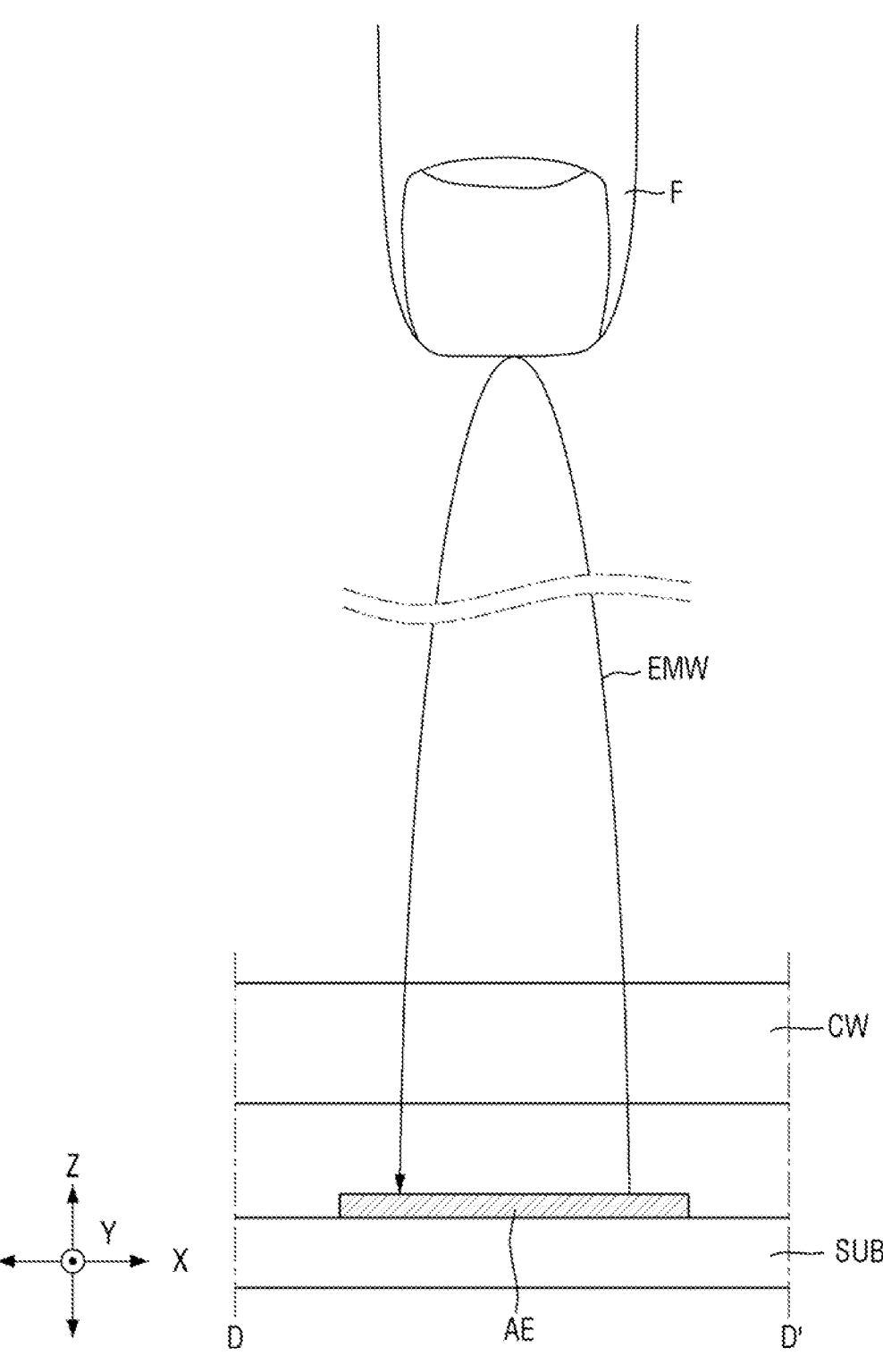
FIG. 18 illustrates proximity touch sensing using an antenna according to one or more embodiments.

FIG. 18 illustrates proximity touch sensing using an antenna according to one or more embodiments. Hereinafter, a proximity touch sensing method of the antenna module AM will be described in detail with reference to FIG. 18.

Referring to FIG. 18, in an embodiment, the antenna driving circuit 350 outputs a transmission signal that has a predetermined frequency to the antenna electrode AE through the feed line AL during a first period. The predetermined frequency is approximately 57.9 GHz to 68.9 GHz, and may be 61.5 GHz. The antenna electrode AE radiates an electromagnetic wave EMW based on the transmission signal during the first period.

When the antenna area AA protrudes in the second direction (Y-axis direction) from the upper side of the main area MA as shown in FIGS. 1 and 2, a length of the antenna electrode AE in the first direction (X-axis direction) is approximately 2 mm i for the antenna electrode AE to transmit and receive electromagnetic waves of about 57.9 to 68.9 GHz of millimeter wave (mmWave).

The electromagnetic wave EMW radiated from the antenna electrode AE is reflected from an object, such as a finger F or a pen, positioned within about 1 m from the cover window CW. The antenna driving circuit 350 receives a reception signal from the antenna electrode AE based on the electromagnetic wave EMW reflected from the object, such as the finger F or the pen, during a second period. For example, the antenna electrode AE is time-division driven to serve as a transmit electrode for the first period and a receive electrode for the second period.

As illustrated in FIG. 18, a proximity touch, such as gesture sensing, can be sensed by transmitting and receiving electromagnetic waves EMW with an ultra-high frequency, such as millimeter waves (mmWave), using the antenna electrode AE.

Figure 19:
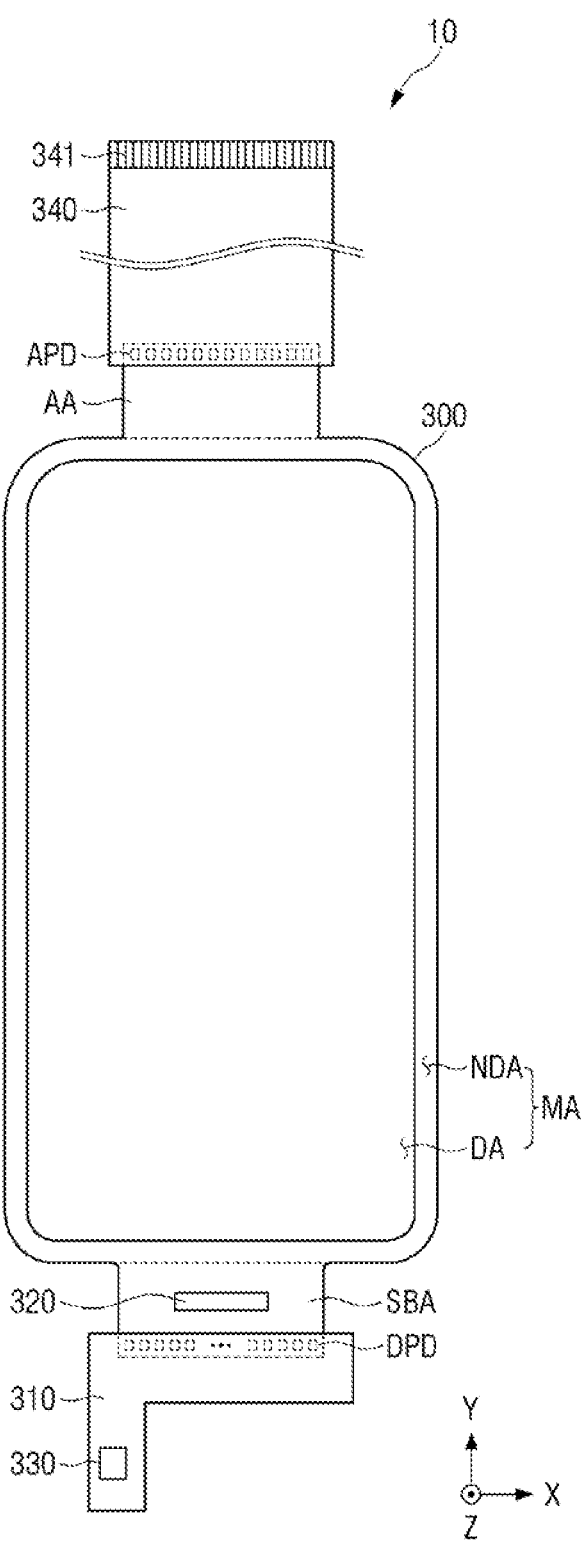
FIGS. 19 and 20 are plan views of a display device according to one or more embodiments.
Figure 20:
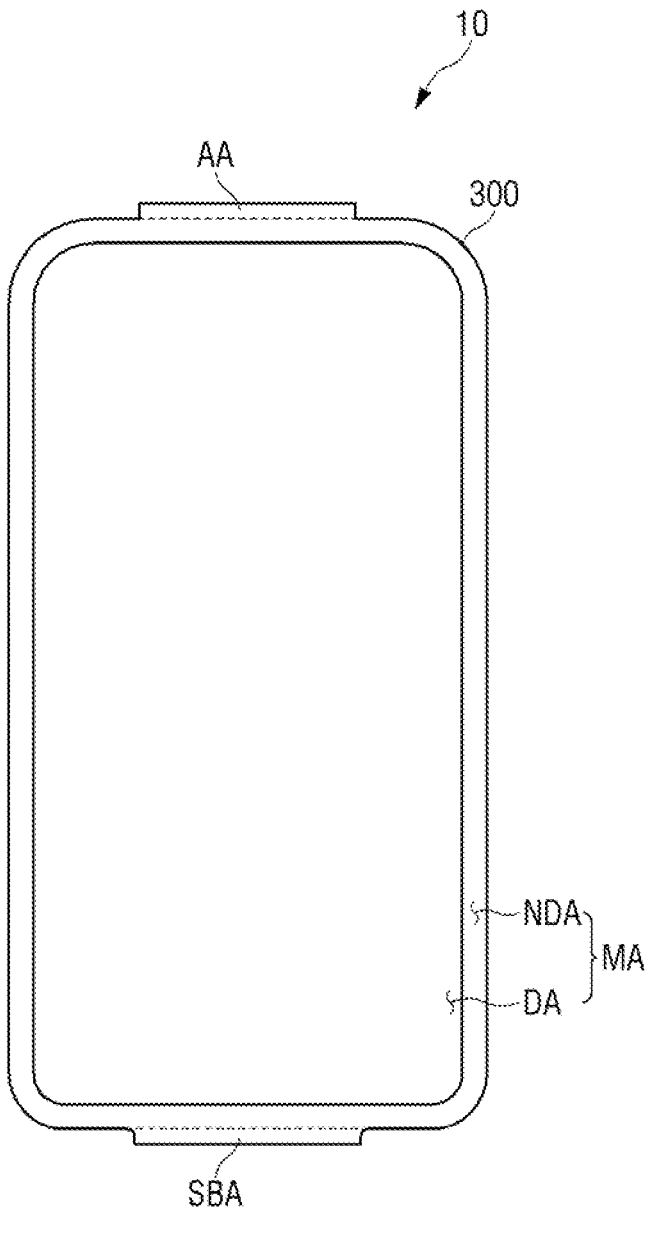
Figure 20:
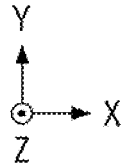

FIGS. 19 and 20 are plan views of a display device according to another one or more embodiments.

The embodiments of FIGS. 19 and 20 differ from the embodiments of FIGS. 1 and 2 in that the antenna area AA is wider in the first direction (X-axis direction). In FIGS. 19 and 20, descriptions that repeat those of the embodiments of FIGS. 1 and 2 may be omitted.

As shown in FIGS. 19 and 20, in an embodiment, when the antenna area AA protrudes from the upper side of the main area MA in the second direction (Y-axis direction), the length of the antenna area AA in the first direction (X-axis direction) is longer. Alternatively, when the antenna area AA protrudes in the first direction (X-axis direction) from the left or right side of the main area MA, the length in the second direction (Y-axis direction) of the antenna area AA is longer. When the antenna area AA is elongated, the transmission and reception sensitivity of electromagnetic waves increase since a plurality of antenna electrodes can be formed in the antenna area AA.

Figure 21:
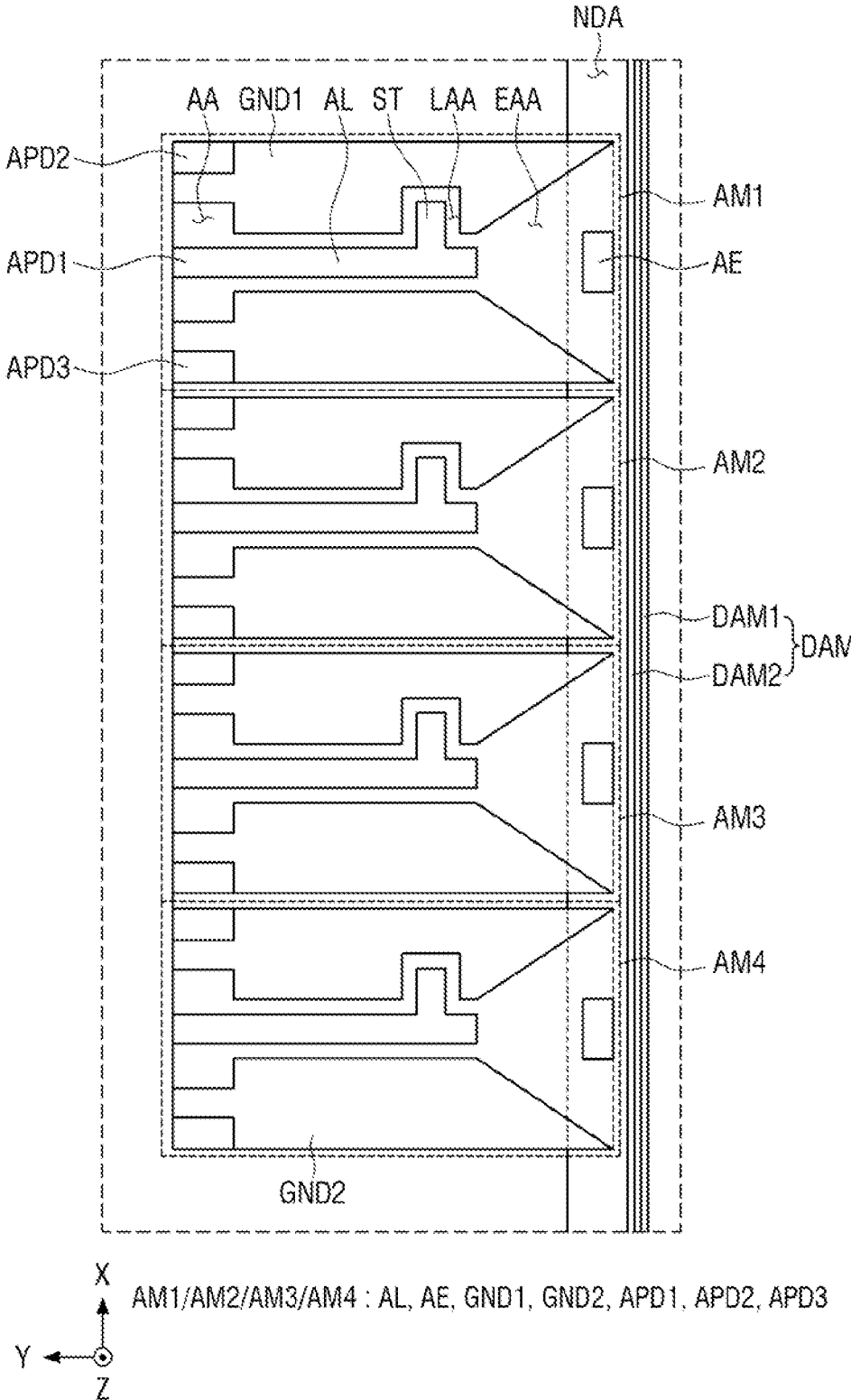
FIG. 21 is a plan view of an antenna area of FIG. 19.
Figure 22:
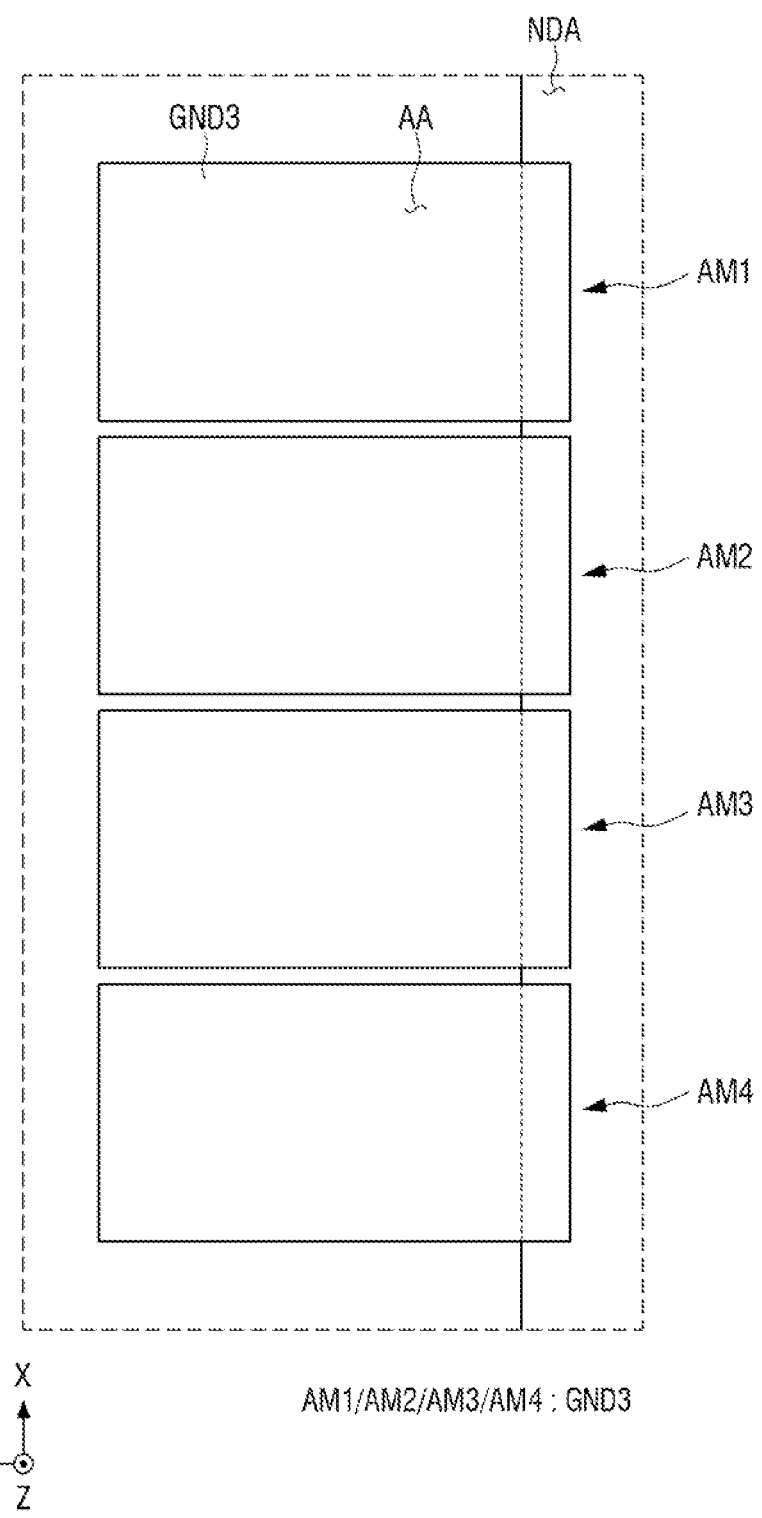
FIG. 22 is a bottom view of an antenna area of FIG. 19.

FIG. 21 is a plan view of an antenna area of FIG. 19. FIG. 22 is a bottom view of an antenna area of FIG. 19.

Referring to FIGS. 21 and 22, in an embodiment, a plurality of antenna modules AM1 to AM4 may be disposed in the antenna area AA. FIGS. 21 and 22 illustrate four antenna modules AM1 to AM4 disposed in the antenna area AA, but the number of antenna modules disposed in the antenna area AA may be determined according to desired antenna performance.

When the antenna area AA protrudes from the upper side of the main area MA in the second direction (Y-axis direction), the plurality of antenna modules AM1 to AM4 are disposed in the first direction (X-axis direction).

A distance between the centers of the antenna electrodes AE of the antenna modules AM1 to AM4 adjacent to each other in the first direction (X-axis direction) varies according to the frequency of the electromagnetic wave to be transmitted and received using the plurality of antenna modules AM1 to AM4. For example, when the frequency of the electromagnetic wave to be transmitted and received is 60 GHz, the distance between the centers of the antenna electrodes AE of adjacent antenna modules is about 2.5 mm. However, embodiments of the present disclosure are not necessarily limited thereto.

Each of the plurality of antenna modules AM1 to AM4 is connected to the antenna driving circuit 350 through the antenna circuit board 340. Each of the plurality of antenna modules AM1 to AM4 is independently driven by the antenna driving circuit 350. For example, each of the plurality of antenna modules AM1 to AM4 is time-division driven to serve as an antenna capable of both transmission and reception. Alternatively, some of the plurality of antenna modules AM1 to AM4 are transmitter antennas that transmit electromagnetic waves, and others are receiver antennas that receive electromagnetic waves. Alternatively, each of the plurality of antenna modules AM1 to AM4 is one antenna array driven by the antenna driving circuit 350, and in this case, beam steering is possible.

Since each of the plurality of antenna modules AM1 to AM4 is substantially the same as the antenna module AM described with reference to FIGS. 11 and 12, a description of each of the plurality of antenna modules AM1 to AM4 will be omitted.

While embodiments of the present disclosure has been particularly shown and described with reference to the drawings, it will be understood by those of ordinary skill in the art that various changes in form and detail may be made therein without departing from the spirit and scope of embodiments of the present disclosure as defined by the following claims. Embodiments of the present disclosure described herein should be considered in a descriptive sense only and not for purposes of limitation.

What is claimed is:

1. A display device, comprising:
a substrate that includes a display area that displays an image, a non-display area disposed around the display area, and an antenna area that protrudes from the non-display area;
an antenna electrode disposed on one surface of the substrate in the non-display area;
a feed line disposed on the one surface of the substrate in the antenna area and spaced apart from the antenna electrode;
a first electrode disposed on the one surface of the substrate in the antenna area and the non-display area and disposed at one side of the feed line; and
a second electrode disposed on the one surface of the substrate in the antenna area and the non-display area and disposed on an other side of the feed line,
wherein a distance between the first electrode and the second electrode increases from one end of the feed line toward the antenna electrode.

2. The display device of claim 1, wherein a minimum distance between the feed line and the first electrode is less than a minimum distance between the antenna electrode and the first electrode.

3. The display device of claim 1, wherein a minimum distance between the feed line and the second electrode is less than a minimum distance between the antenna electrode and the second electrode.

4. The display device of claim 1,
wherein the antenna area and the non-display area include a feed area in which the feed line is disposed, and a radiation area in which the antenna electrode is disposed,
wherein the first electrode is disposed in the feed area and the radiation area, and
wherein a width of the first electrode decreases from a boundary of the feed area and the radiation area toward an end of the first electrode in the radiation area.

5. The display device of claim 1,
wherein the antenna area and the non-display area include a feed area in which the feed line is disposed, and a radiation area in which the antenna electrode is disposed, and
wherein the second electrode is disposed in the feed area and the radiation area, and
wherein a width of the second electrode decreases from a boundary of the feed area and the radiation area to an end of the second electrode in the radiation area.

6. The display device of claim 1,
wherein the feed line extends in one direction, and
wherein the display device further comprises a stub that protrudes from one side of the feed line in another direction that crosses the one direction.

7. The display device of claim 1, wherein the antenna electrode is a patch antenna electrode that has a rectangular planar shape.

8. The display device of claim 1, further comprising:
a third electrode disposed on another surface of the substrate in the antenna area.

9. The display device of claim 8, wherein the third electrode overlaps the feed line, the first electrode, and the second electrode in a thickness direction of the substrate.

10. The display device of claim 8, wherein a thickness of the third electrode is greater than a thickness of the antenna electrode, a thickness of the feed line, a thickness of the first electrode, and a thickness of the second electrode.

11. The display device of claim 1, wherein a thickness of the antenna electrode, a thickness of the feed line, a thickness of the first electrode, and a thickness of the second electrode are are equal to each other.

12. The display device of claim 1, further comprising:
a first antenna pad disposed at one end of the feed line, a second antenna pad disposed at one end of the first electrode, a third antenna pad disposed at one end of the second electrode, and an antenna circuit board connected to the first antenna pad, the second antenna pad, and the third antenna pad;

a conductive adhesive member disposed between each of the first antenna pad, the second antenna pad, and the third antenna pad and the antenna circuit board;

a main circuit board that includes a second connector connected to a first connector that is disposed at one end of the antenna circuit board; and an antenna driving circuit disposed on the main circuit board and configured to transmit an electromagnetic wave signal to the antenna electrode or receive an electromagnetic wave signal from the antenna electrode.

13. The display device of claim 1, further comprising:

a dam that surrounds the display area in the non-display area, wherein the antenna electrode is disposed between the dam and an edge of the substrate.

14. A display device, comprising:

a substrate that includes a display area that displays an image, a non-display area disposed around the display area, and an antenna area that protrudes from the non-display area;

an antenna electrode disposed on one surface of the substrate in the non-display area;

a feed line disposed on the one surface of the substrate in the antenna area, wherein the feed line is spaced apart from the antenna electrode and extends in one direction;

a first electrode disposed on the one surface of the substrate in the antenna area and the non-display area and at one side of the feed line;

a second electrode disposed on the one surface of the substrate in the antenna area and the non-display area and at another side of the feed line; and a stub that protrudes from the one side of the feed line in another direction that crosses the one direction.

15. The display device of claim 14, wherein a distance between the first electrode and the second electrode increases from one end of the feed line toward the antenna electrode.

16. The display device of claim 14, wherein a minimum distance between the feed line and the first electrode is less than a minimum distance between the antenna electrode and the first electrode.

17. The display device of claim 14, wherein a minimum distance between the feed line and the second electrode is less than a minimum distance between the antenna electrode and the second electrode.

18. The display device of claim 14, wherein the antenna area and the non-display area include a feed area in which the feed line is disposed, and a radiation area in which the antenna electrode is disposed, and wherein the first electrode is disposed in the feed area and the radiation area, and wherein a width of the first electrode decreases from a boundary of the feed area and the radiation area to one end of the first electrode in the radiation area.

19. The display device of claim 14, wherein the antenna area and the non-display area include a feed area in which the feed line is disposed, and a radiation area in which the antenna electrode is disposed, and wherein the second electrode is disposed in the feed area and the radiation area, and wherein a width of the second electrode decreases from a boundary of the feed area and the radiation area to one end of the second electrode in the radiation area.

20. The display device of claim 14, wherein an area of the second electrode is greater than an area of the first electrode.

21. A display device, comprising:

a substrate;

a gate insulating layer disposed on one surface of the substrate;

a gate electrode of a thin film transistor disposed on the gate insulating layer;

a first interlayer insulating layer disposed on the gate electrode of the thin film transistor;

a first connection electrode disposed on the first interlayer insulating layer and connected to an active layer of the thin film transistor through a contact hole that penetrates the gate insulating layer and the first interlayer insulating layer;

a first organic layer disposed on the first connection electrode;

a pixel electrode disposed on the first organic layer; and an antenna electrode, a feed line, a first electrode, and a second electrode disposed on the one surface of the substrate and spaced apart from each other, wherein the antenna electrode, a feed line, a first electrode, and a second electrode include:

a first electrode layer made of a same material as the gate electrode of the thin film transistor;

a second electrode layer made of a same material as the first connection electrode; and a third electrode layer made of a same material as the pixel electrode.

22. The display device of claim 21, further comprising:

a light emitting layer disposed on the pixel electrode;

a common electrode disposed on the light emitting layer;

an encapsulation layer disposed on the common electrode; and a sensor electrode disposed on the encapsulation layer, wherein the antenna electrode, the feed line, the first electrode, and the second electrode further include a fourth electrode layer made of a same material as the sensor electrode.

23. The display device of claim 22, further comprising:

a third electrode disposed on another surface of the substrate, wherein a thickness of the third electrode is greater than a thickness of the first antenna electrode layer, a thickness of the second antenna electrode layer, a thickness of the third antenna electrode layer, and a thickness of the fourth antenna electrode layer.

* * * * *